US011217423B2

(12) United States Patent
Ren et al.

(10) Patent No.: US 11,217,423 B2
(45) Date of Patent: Jan. 4, 2022

(54) APPARATUS OF PLURAL CHARGED-PARTICLE BEAMS

(71) Applicant: ASML Netherlands B.V., AH Veldhoven (NL)

(72) Inventors: Weiming Ren, San Jose, CA (US); Shuai Li, Beijing (CN); Xuedong Liu, San Jose, CA (US); Zhongwei Chen, San Jose, CA (US); Jack Jau, Los Altos Hills, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/357,309

(22) Filed: Mar. 18, 2019

(65) Prior Publication Data

US 2019/0279842 A1 Sep. 12, 2019

Related U.S. Application Data

(63) Continuation of application No. 15/078,369, filed on Mar. 23, 2016, now Pat. No. 10,236,156.

(Continued)

(51) Int. Cl.
 *H01J 37/28* (2006.01)

(52) U.S. Cl.
 CPC ....... *H01J 37/28* (2013.01); *H01J 2237/0435* (2013.01); *H01J 2237/1205* (2013.01);
 (Continued)

(58) Field of Classification Search
 CPC .. H01J 37/04; H01J 37/09; H01J 37/10; H01J 37/14; H01J 37/266; H01J 37/3007; H01J 2237/06; H01J 2237/14; H01J 2237/047; H01J 2237/0435; H01J 2237/0458; H01J 2237/04735; H01J 2237/04756; H01J 2237/2817; H01J 2237/31774
 See application file for complete search history.

(56) References Cited

U.S. PATENT DOCUMENTS

| 3,714,424 A | 1/1973 | Weber |
| 3,842,271 A | 10/1974 | Gee et al. |

(Continued)

OTHER PUBLICATIONS

"Low Vacuum Secondary Electron Detector," JEOL, USA, Peabody MA, www.jeolusa.com 2011.

(Continued)

*Primary Examiner* — David E Smith
*Assistant Examiner* — Hsien C Tsai
(74) *Attorney, Agent, or Firm* — Finnegan, Henderson, Farabow, Garrett & Dunner, LLP

(57) ABSTRACT

A multi-beam apparatus for observing a sample with oblique illumination is proposed. In the apparatus, a new source-conversion unit changes a single electron source into a slant virtual multi-source array, a primary projection imaging system projects the array to form plural probe spots on the sample with oblique illumination, and a condenser lens adjusts the currents of the plural probe spots. In the source-conversion unit, the image-forming means not only forms the slant virtual multi-source array, but also compensates the off-axis aberrations of the plurality of probe spots. The apparatus can provide dark-field images and/or bright-field images of the sample.

18 Claims, 16 Drawing Sheets

Related U.S. Application Data

(60) Provisional application No. 62/137,978, filed on Mar. 25, 2015.

(52) U.S. Cl.
CPC . *H01J 2237/1501* (2013.01); *H01J 2237/151* (2013.01); *H01J 2237/2806* (2013.01); *H01J 2237/2813* (2013.01)

(56) References Cited

U.S. PATENT DOCUMENTS

| | | | |
|---|---|---|---|
| 4,068,123 A | 1/1978 | Kokubo | |
| 4,743,757 A | 5/1988 | Coates | |
| 4,897,545 A | 1/1990 | Danilatos | |
| 4,962,306 A | 10/1990 | Hodgson et al. | |
| 5,408,098 A | 4/1995 | Wells | |
| 5,422,486 A | 6/1995 | Herrmann et al. | |
| 6,211,525 B1 | 4/2001 | Cowham | |
| 6,300,629 B1 | 10/2001 | Lawrence | |
| 6,392,231 B1 | 5/2002 | Chen | |
| 6,627,886 B1 | 9/2003 | Shachal et al. | |
| 6,627,896 B1 | 9/2003 | Hashimoto et al. | |
| 6,730,907 B1 | 5/2004 | Feuerbaum et al. | |
| 6,872,944 B2 | 3/2005 | Todokoro et al. | |
| 6,943,349 B2 | 9/2005 | Adamec et al. | |
| 7,009,187 B2 | 3/2006 | Gerlach et al. | |
| 7,244,949 B2 | 7/2007 | Knippelmeyer et al. | |
| 7,276,694 B1 | 10/2007 | Bertsche | |
| 7,339,167 B2 | 3/2008 | Oshima et al. | |
| 7,544,937 B2 | 6/2009 | Frosien | |
| 7,880,143 B2 | 2/2011 | Tanimoto et al. | |
| 8,203,119 B2 | 6/2012 | Degenhardt et al. | |
| 8,222,600 B2 | 7/2012 | Zarchin et al. | |
| 8,294,095 B2 | 10/2012 | Chen et al. | |
| 8,767,038 B2 | 7/2014 | Miyamoto et al. | |
| 8,791,425 B2 | 7/2014 | Ren et al. | |
| 9,035,249 B1 * | 5/2015 | Frosien | H01J 37/1474 250/310 |
| 9,053,905 B2 | 6/2015 | Hoque et al. | |
| 9,153,413 B2 * | 10/2015 | Almogy | H01J 37/05 |
| 2002/0109089 A1 | 8/2002 | Krans et al. | |
| 2005/0001165 A1 | 1/2005 | Parker | |
| 2006/0033035 A1 | 2/2006 | Itzkovitch et al. | |
| 2006/0054817 A1 | 3/2006 | Parker | |
| 2006/0113474 A1 | 6/2006 | Todokoro et al. | |
| 2006/0186351 A1 | 8/2006 | Nishiyama et al. | |
| 2006/0249686 A1 | 11/2006 | Slowko | |
| 2006/0289748 A1 | 12/2006 | Schon et al. | |
| 2007/0029479 A1 | 2/2007 | Gignac et al. | |
| 2007/0120056 A1 | 5/2007 | Nagatomo et al. | |
| 2008/0023641 A1 | 1/2008 | Takeuchi et al. | |
| 2008/0035843 A1 | 2/2008 | Hatano et al. | |
| 2008/0258060 A1 | 10/2008 | Frosien et al. | |
| 2009/0230304 A1 | 9/2009 | Hatano et al. | |
| 2009/0242792 A1 | 10/2009 | Hosoya et al. | |
| 2010/0012838 A1 | 1/2010 | Hatakeyama et al. | |
| 2010/0090109 A1 | 4/2010 | Hatano et al. | |
| 2010/0200750 A1 | 8/2010 | Mantz et al. | |
| 2012/0037802 A1 | 2/2012 | Kneedler | |
| 2012/0043463 A1 | 2/2012 | Agemura et al. | |
| 2012/0112063 A1 | 5/2012 | Schertel | |
| 2012/0298864 A1 | 11/2012 | Morishita et al. | |
| 2013/0037715 A1 | 2/2013 | Boughorbel et al. | |
| 2013/0214156 A1 | 8/2013 | Kneedler et al. | |
| 2013/0277554 A1 | 10/2013 | Ren et al. | |
| 2013/0299698 A1 | 11/2013 | Schamber et al. | |
| 2013/0320228 A1 | 12/2013 | Lanio | |
| 2014/0070098 A1 | 3/2014 | Sytar et al. | |
| 2014/0197310 A1 | 7/2014 | Hill et al. | |
| 2014/0246584 A1 | 9/2014 | Hyun et al. | |
| 2014/0353498 A1 | 12/2014 | Shur | |

OTHER PUBLICATIONS

Jeff Jones "Agilent 101: Intro to Nanotechnology," published at http://www.agilent.com/labs/features/2011_101_nano.html in Jun. 2011.

* cited by examiner

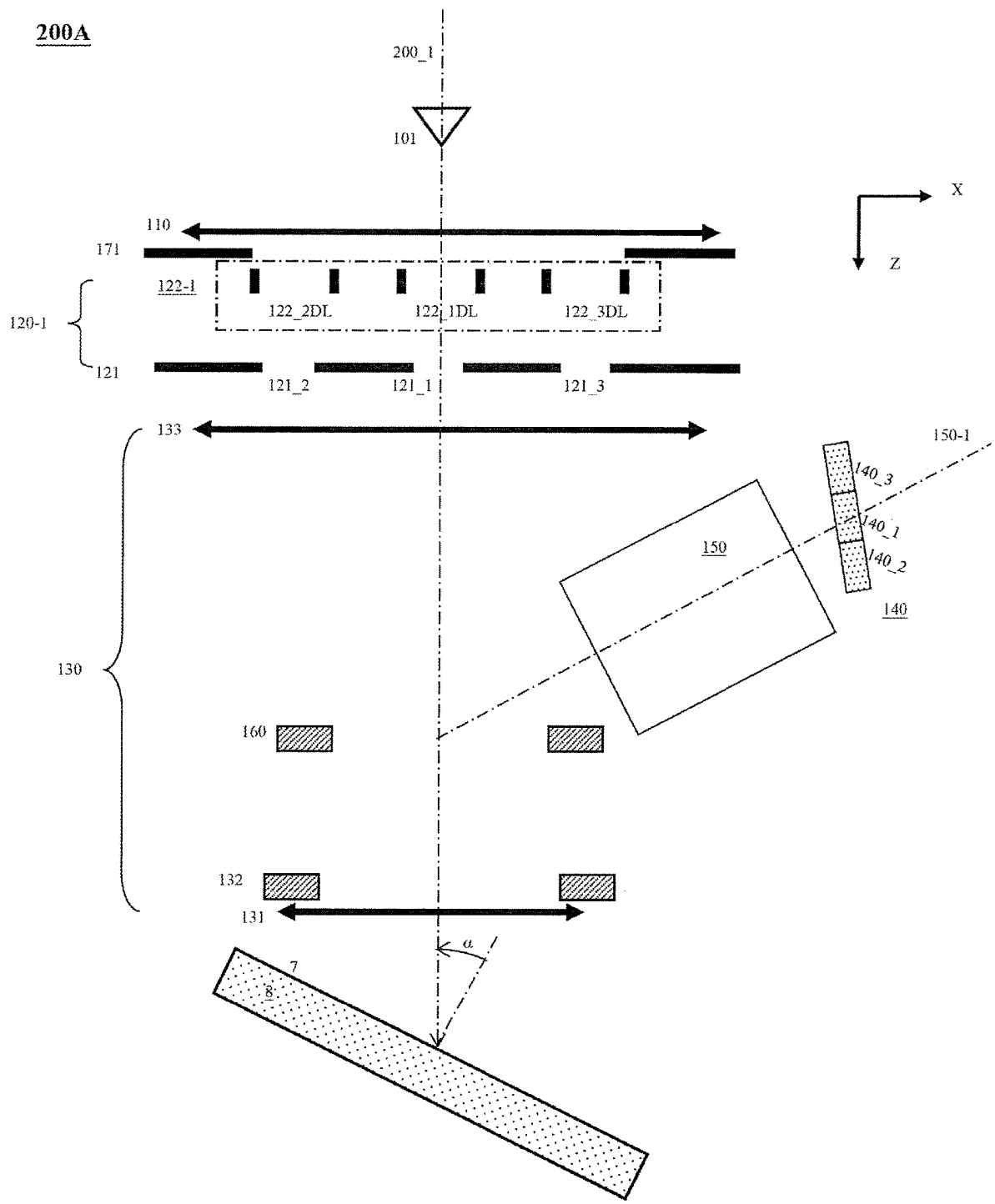
Figure 2A (Invention)

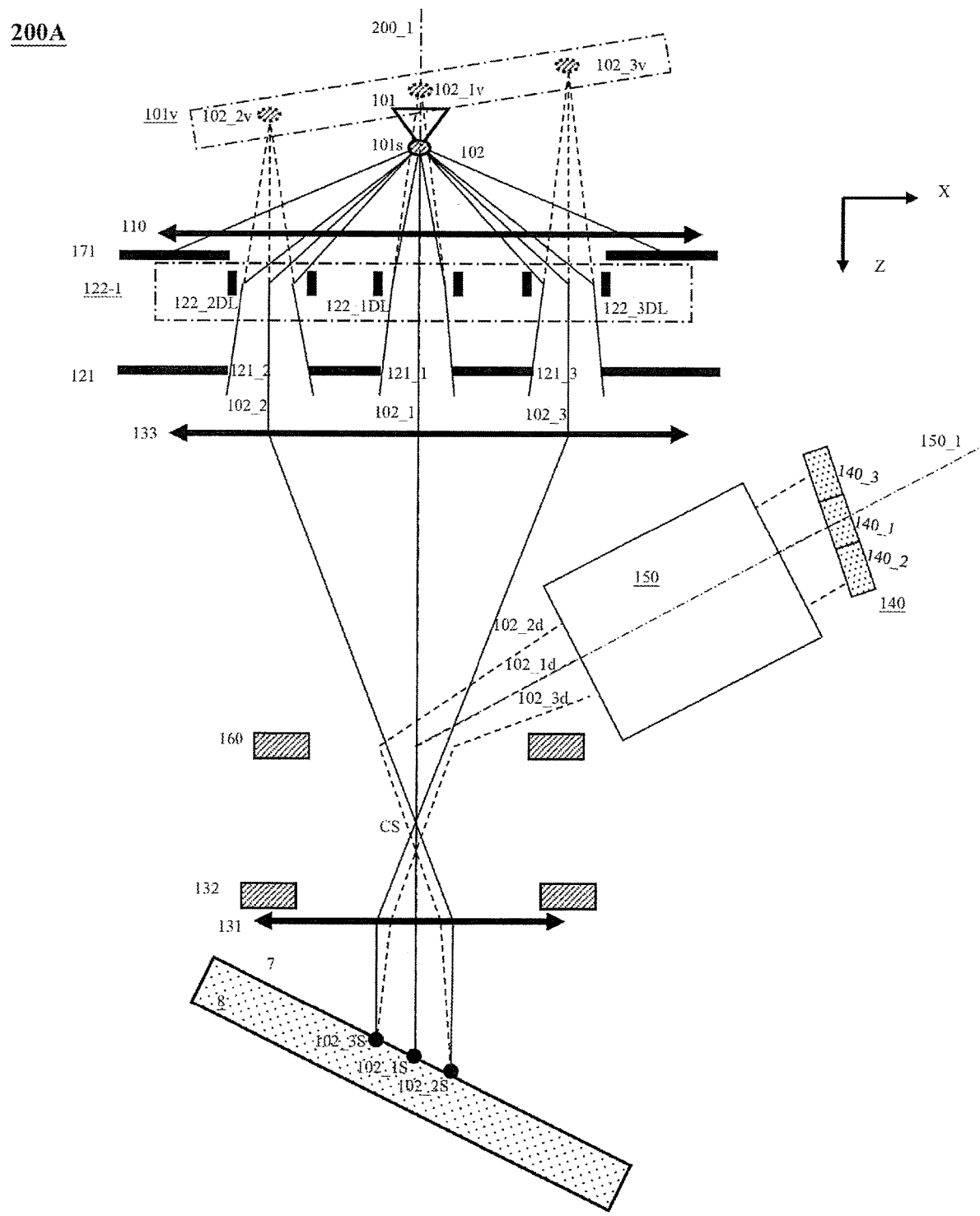
Figure 2B(Invention)

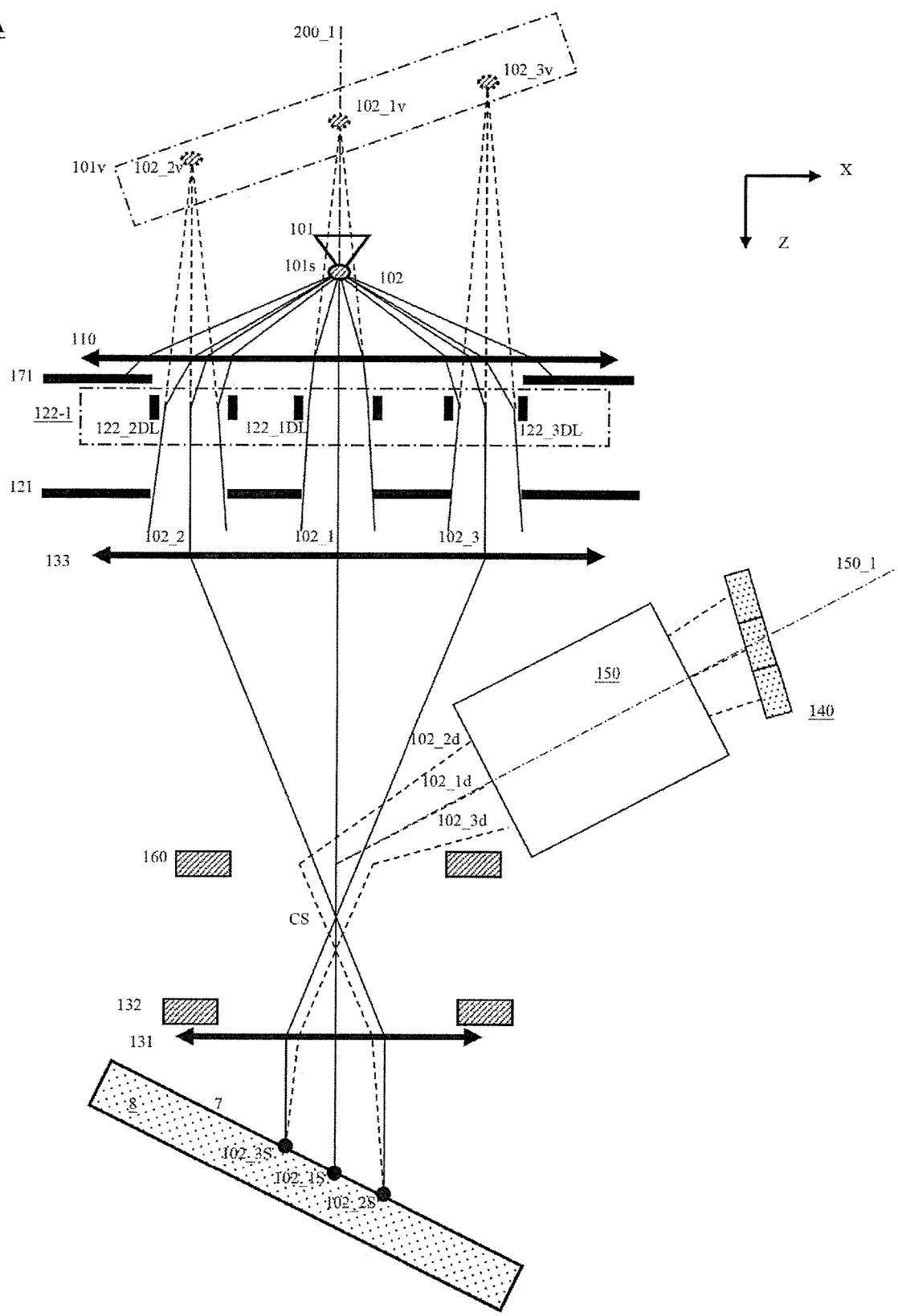
Figure 2C (Invention)

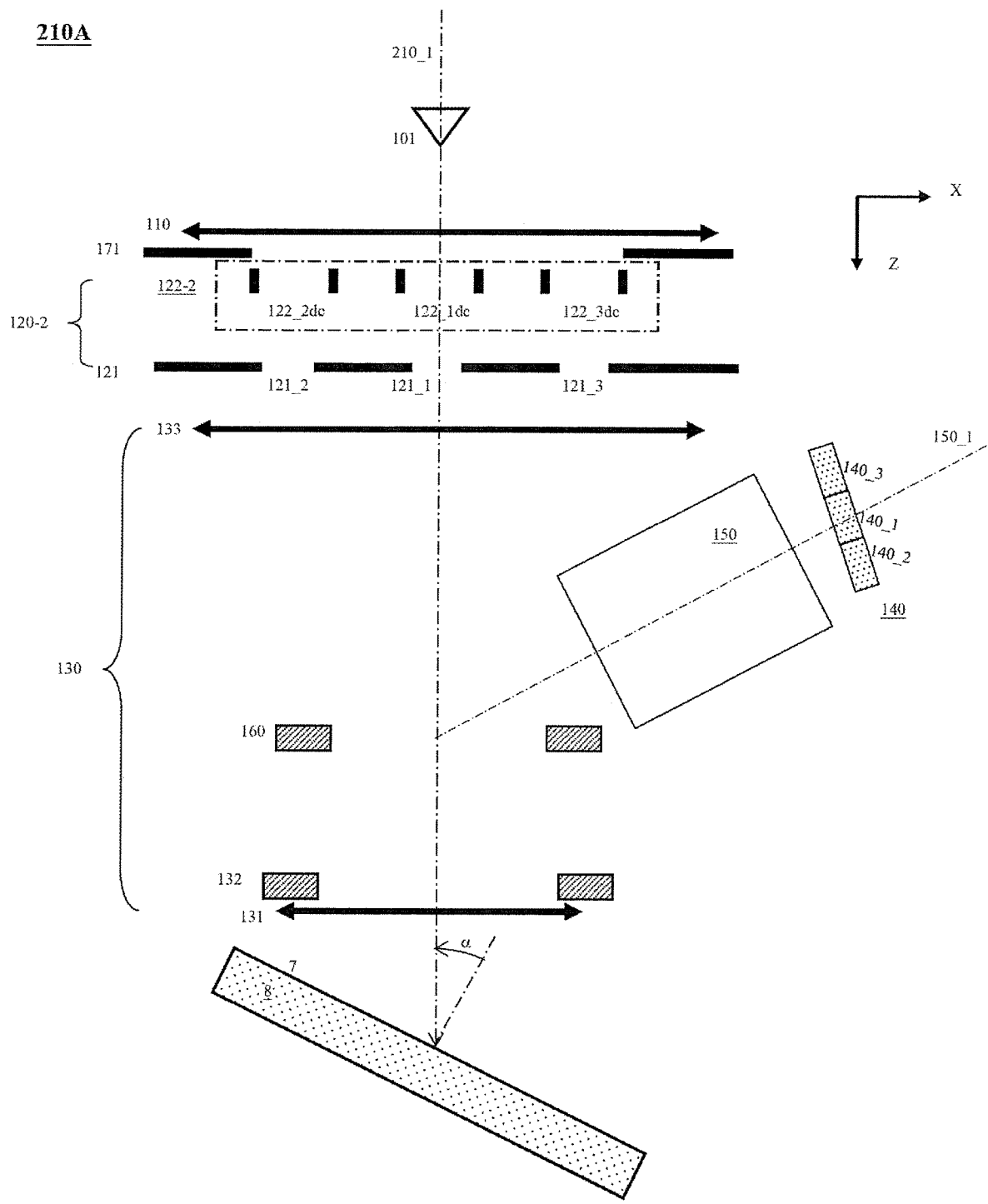
Figure 3 (Invention)

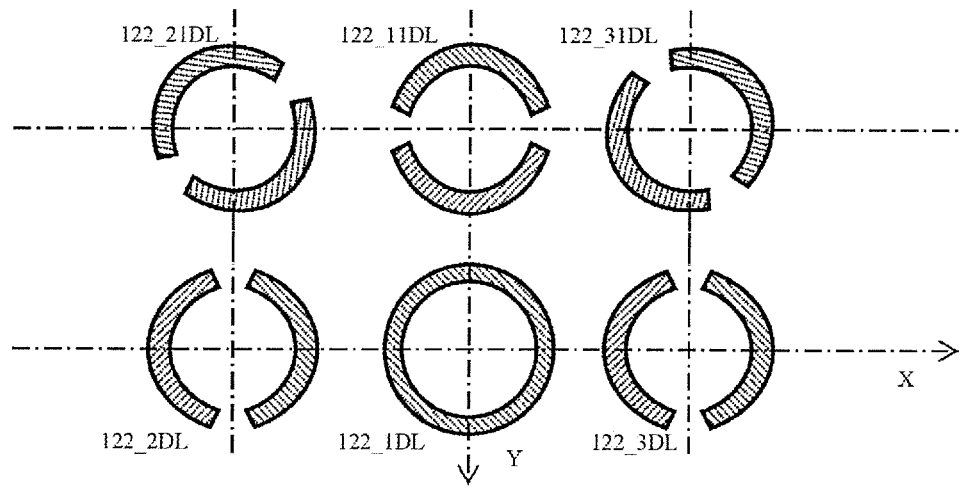
Figure 4A (Invention)
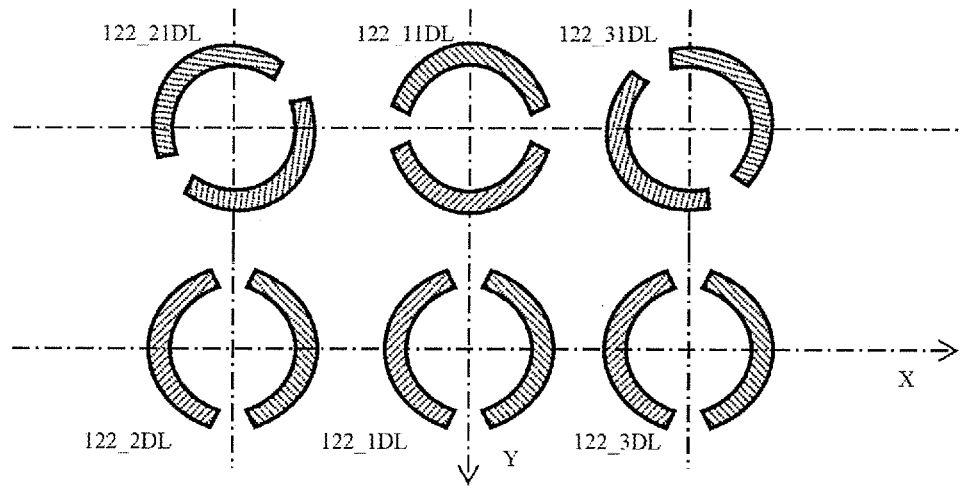
Figure 4B (Invention)

122-1
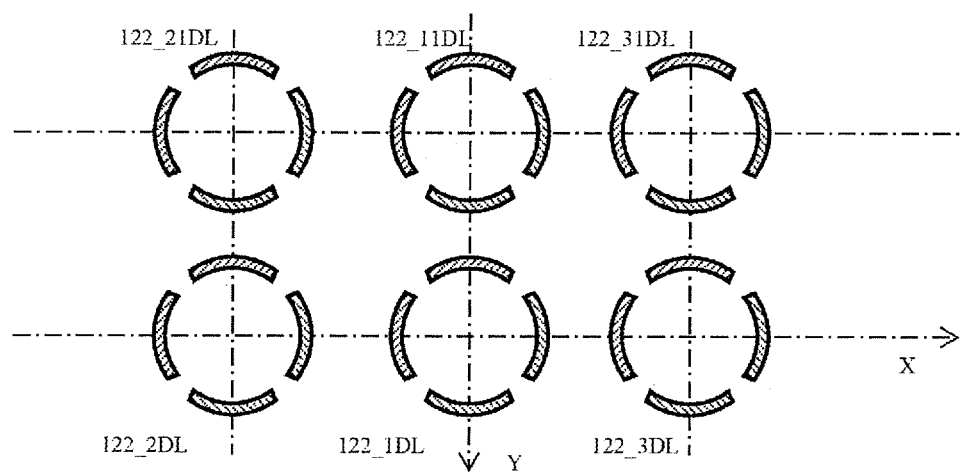
Figure 4C (Invention)

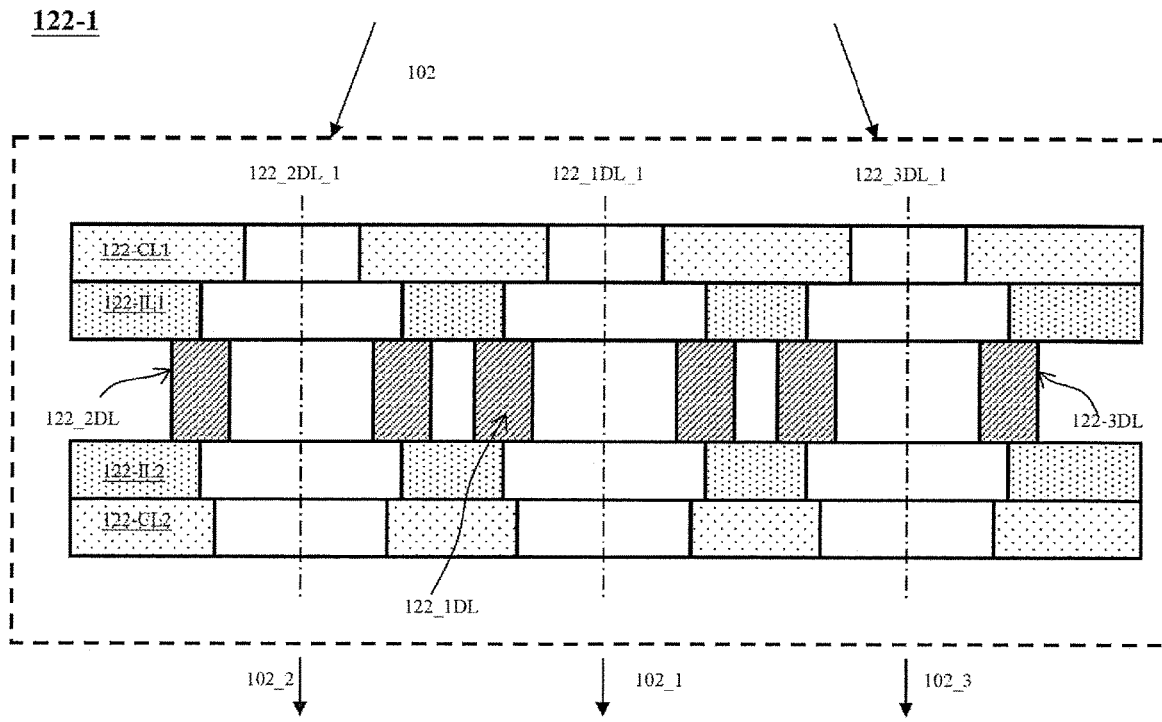
Figure 4D (Invention)
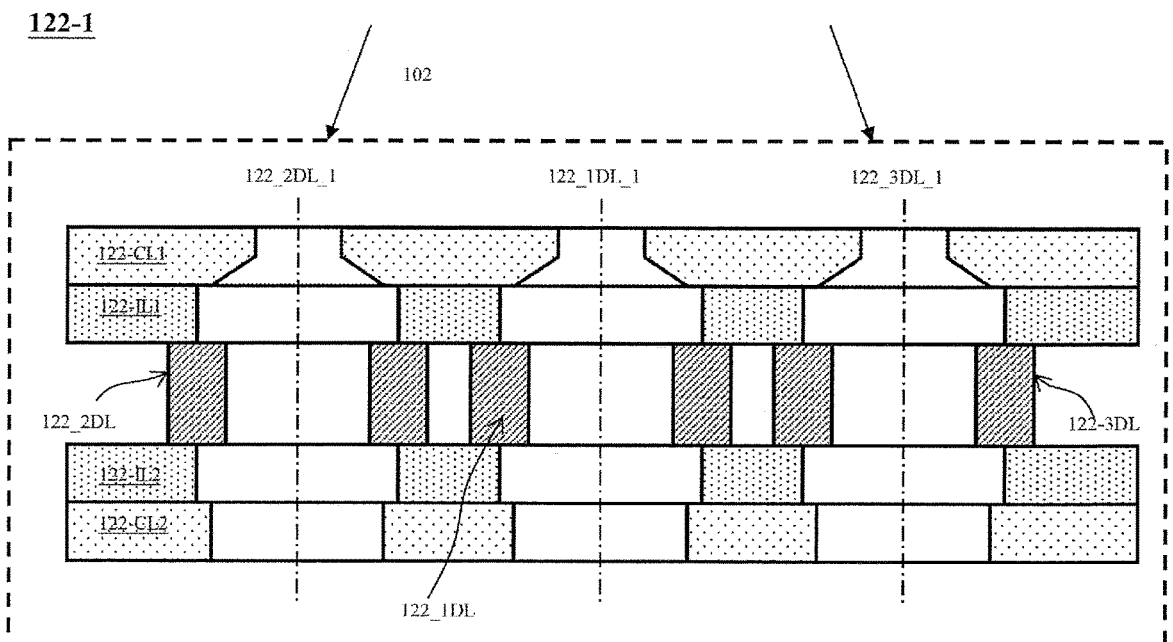
Figure 4E (Invention)

122-2
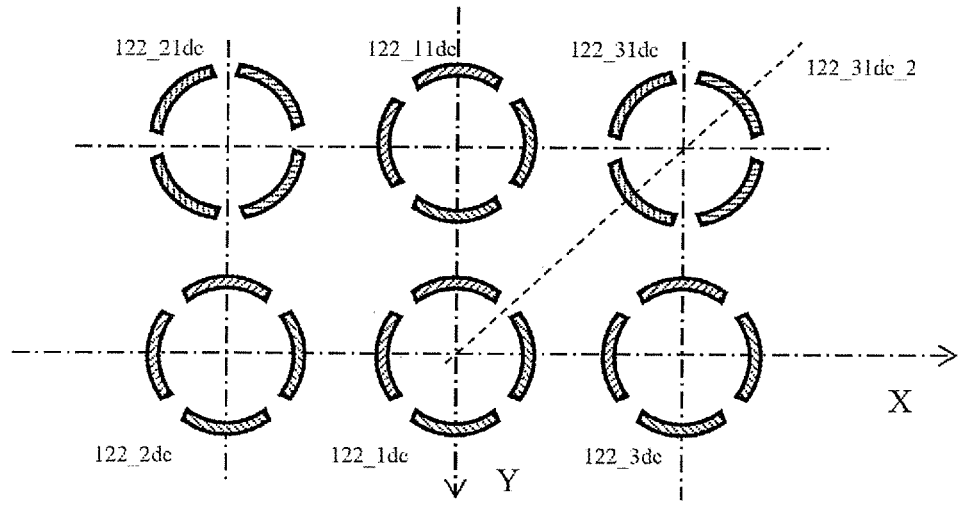
Figure 5A (Invention)
122-2
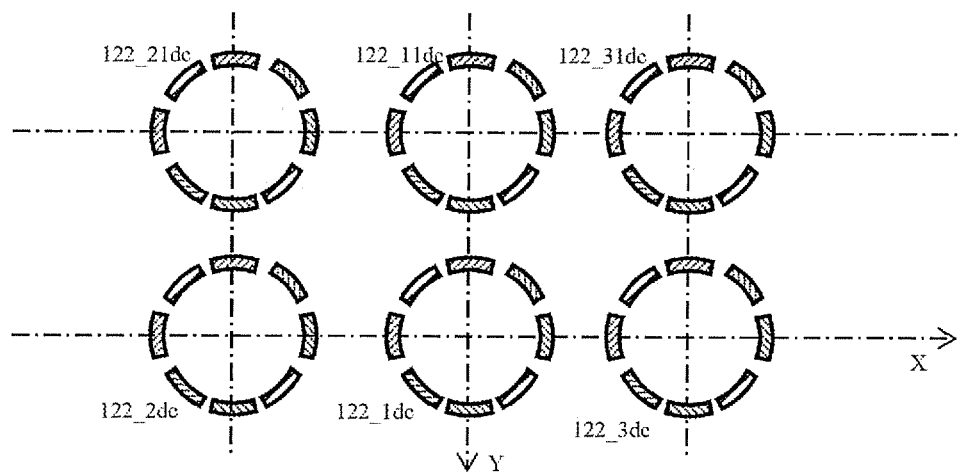
Figure 5B (Invention)

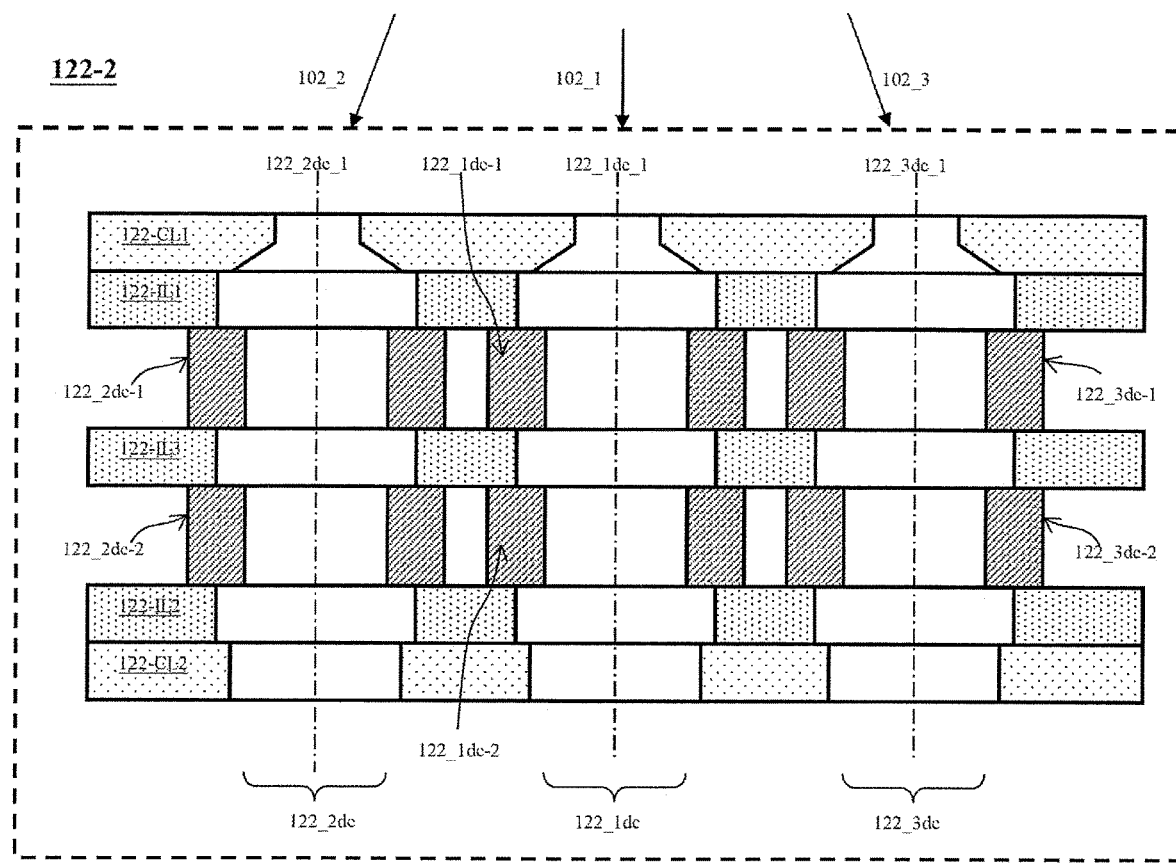
Figure 6A (Invention)
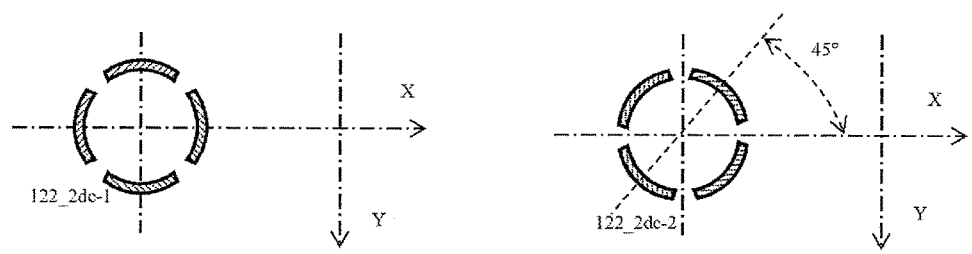
Figure 6B (Invention)

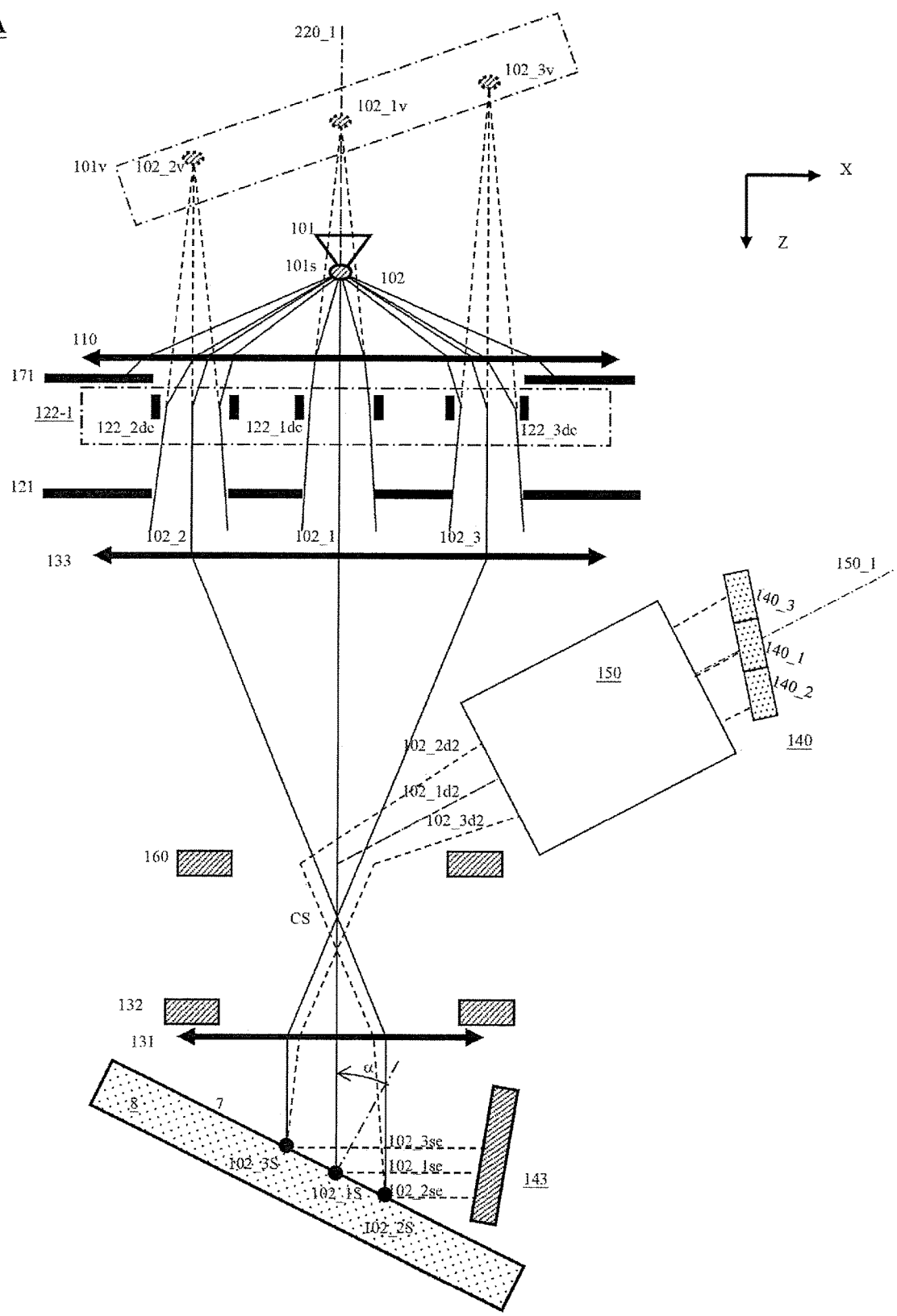
Figure 7 (Invention)

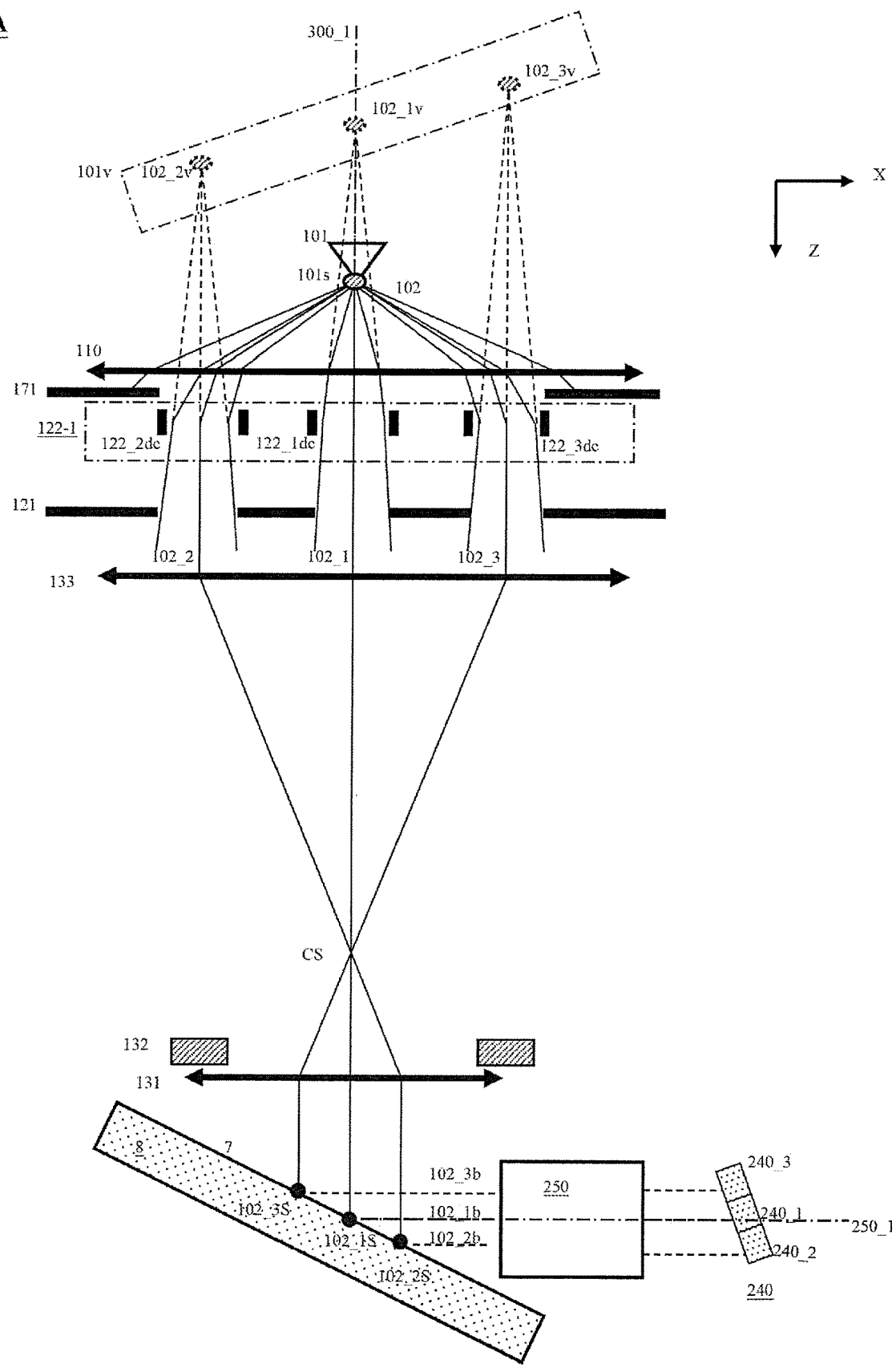
Figure 9 (Invention)

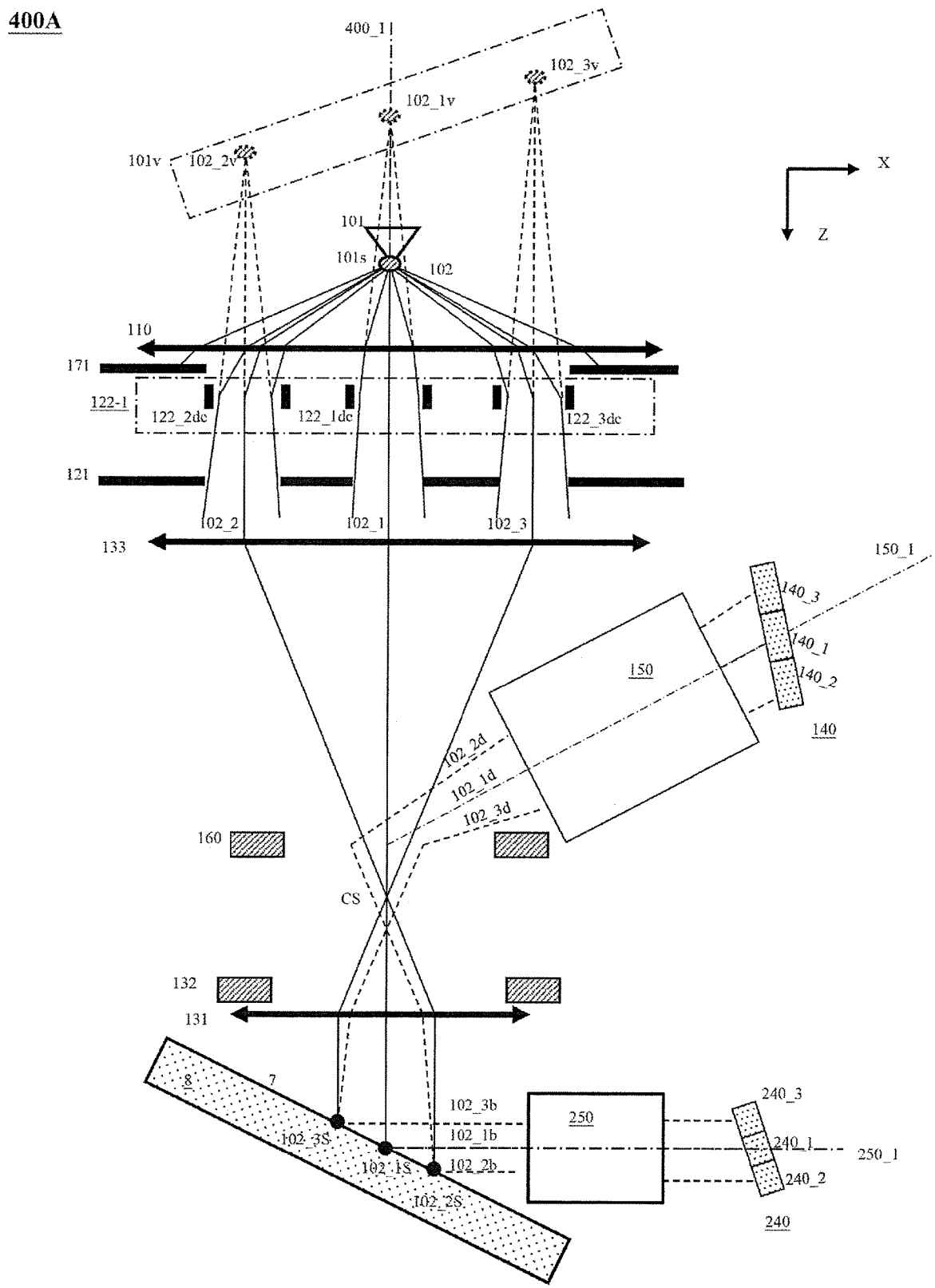
Figure 10 (Invention)

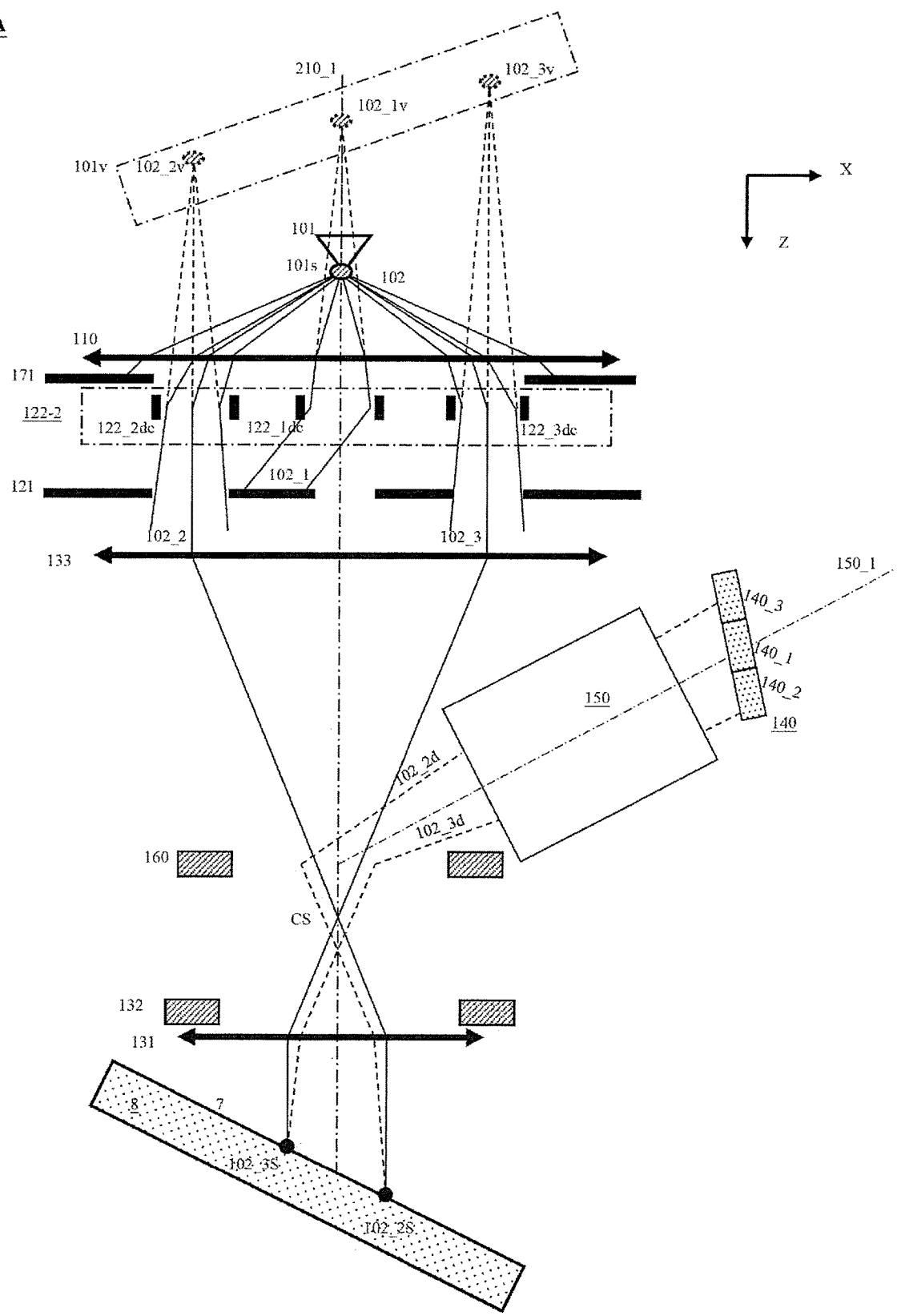
Figure 11A (Invention)

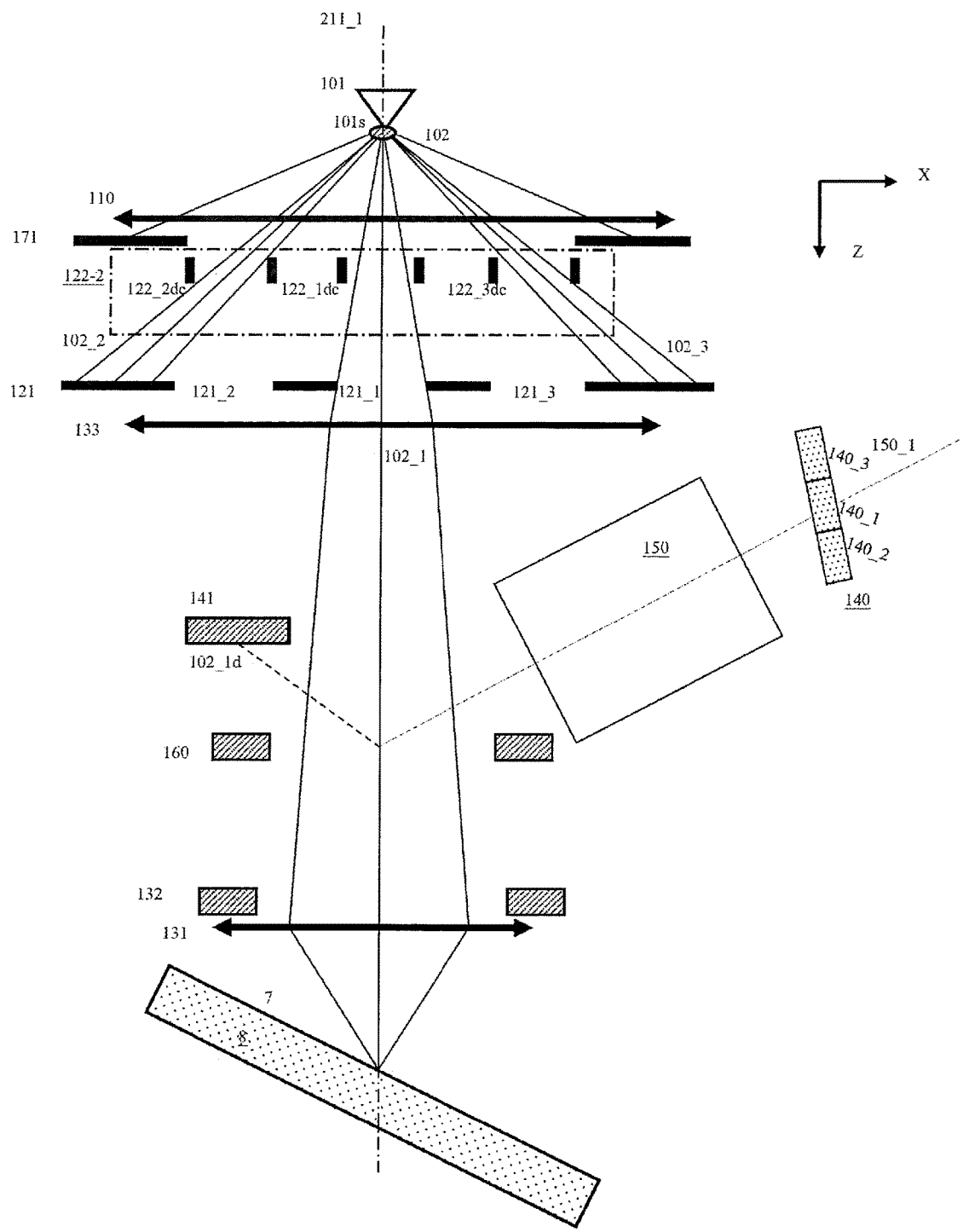
Figure 11B (Invention)

APPARATUS OF PLURAL CHARGED-PARTICLE BEAMS

CLAIM OF PRIORITY

This application is a continuation application of application Ser. No. 15/078,369, entitled "Apparatus of Plural Charged-Particle Beams," filed Mar. 23, 2016, which claims the benefit of priority of U.S. provisional application No. 62/137,978, entitled to Ren et al. filed Mar. 25, 2015 and entitled "Apparatus of Plural Charged-Particle Beams", both of which are incorporated herein by reference in their entireties.

CROSS REFERENCE TO RELATED APPLICATIONS

This application is related to U.S. application Ser. No. 15/065,342 entitled to Weiming Ren et al. filed on Mar. 9, 2016 and entitled "Apparatus of Plural Charged-Particle Beams", the entire disclosures of which are incorporated herein by reference.

This application is related to U.S. application Ser. No. 14/220,358 entitled to Zhongwei Chen et al. filed on Mar. 20, 2014 and entitled "Charged Particle Beam Apparatus", the entire disclosures of which are incorporated herein by reference.

BACKGROUND OF THE INVENTION

1. Field of the Invention

The present invention relates to a charged-particle apparatus with a plurality of charged-particle beams. More particularly, it relates to an apparatus which employs plural charged-particle beams to simultaneously acquire images of plural scanned regions of an observed area on a sample surface. Hence, the apparatus can be used to inspect defects and/or particles on wafers/masks with high detection efficiency and high throughput in semiconductor manufacturing industry.

2. Description of the Prior Art

For manufacturing semiconductor IC chips, pattern defects and/or uninvited particles (residuals) inevitably appear on surfaces of wafers/masks during fabrication processes, which reduce the yield to a great degree. To meet the more and more advanced requirements on performance of IC chips, the patterns with smaller and smaller critical feature dimensions have been adopted. Accordingly, the conventional yield management tools with optical beam gradually become incompetent due to diffraction effect, and yield management tools with electron beam are more and more employed. Compared to a photon beam, an electron beam has a shorter wavelength and thereby possibly offering superior spatial resolution. Currently, the yield management tools with electron beam employ the principle of scanning electron microscope (SEM) with a single electron beam, which therefore can provide higher resolution but can not provide throughputs competent for mass production. Although the higher and higher beam currents can be used to increase the throughputs, the superior spatial resolutions will be fundamentally deteriorated by Coulomb Effect.

For mitigating the limitation on throughput, instead of using a single electron beam with a large current, a promising solution is to use a plurality of electron beams each with a small current. The plurality of electron beams forms a plurality of probe spots on one being-inspected or observed surface of a sample. For the sample surface, the plurality of probe spots can respectively and simultaneously scan a plurality of small scanned regions within a large observed area on the sample surface. The electrons of each probe spot generate secondary electrons from the sample surface where they land on. The secondary electrons comprise slow secondary electrons (energies≤50 eV, simplified as SE for one and SEs for plurality) and backscattered electrons (energies close to landing energies of the electrons, simplified as BSE for one and BSEs for plurality). The secondary electrons from the plurality of small scanned regions can be respectively and simultaneously collected by a plurality of electron detectors. Consequently, the image of the large observed area including all of the small scanned regions can be obtained much faster than scanning the large observed area with a single beam.

The plurality of electron beams can be either from a plurality of electron sources respectively, or from a single electron source. For the former, the plurality of electron beams is usually focused onto and scans the plurality of small scanned regions by a plurality of columns respectively, and the secondary electrons from each scanned region are detected by one electron detector inside the corresponding column. The apparatus therefore is generally called as a multi-column apparatus. The plural columns can be either independent or share a multi-axis magnetic or electromagnetic-compound objective lens (such as U.S. Pat. No. 8,294,095). On the sample surface, the beam interval between two adjacent beams is usually as large as 30-50 mm.

For the latter, a source-conversion unit is used to generate a plurality of parallel real or virtual images of the single electron source. Each image is formed by one part or beamlet of the primary electron beams generated by the single electron source, and therefore can be taken as one sub-source emitting the one beamlet. In this way, the single electron source is virtually changed into a plurality of sub-sources or a real or virtual multi-source array. Within the source-conversion unit, the beamlet intervals are at micro meter level so as to make more beamlets available, and hence the source-conversion unit can be made by semiconductor manufacturing process or MEMS (Micro Electro-Mechanical Systems) process. Naturally, one primary projection imaging system and one deflection scanning unit within one single column are used to project the plurality of parallel images onto and scan the plurality of small scanned regions respectively, and one secondary projection imaging system focuses the plurality of secondary electron beams therefrom to be respectively detected by a plurality of detection elements of one electron detection device inside the single column. The plurality of detection elements can be a plurality of electron detectors placed side by side or a plurality of pixels of one electron detector. The apparatus therefore is generally called as a multi-beam apparatus and the conventional yield management tool with a single electron beam is called as a single-beam apparatus.

Conventionally, the source-conversion unit comprises one image-forming means and one beamlet-forming means or one beamlet-limit means. The image-forming means basically comprises a plurality of image-forming elements, and each image-forming element can be a round lens or a deflector. The beamlet-forming means and the beamlet-limit means are respectively above and below the image-forming means and have a plurality of beam-limit openings. In one source-conversion unit with one beamlet-forming means, at first the plurality of beam-limit openings divides the primary electron beam into a plurality of beamlets, and then the plurality of image-forming elements (round lenses or deflectors) focuses or deflects the plurality of beamlets to form the plurality of parallel real or virtual images. U.S. Pat. Nos. 6,943,349, 7,244,949, 7,880,443 respectively propose an multi-beam apparatus with one source-conversion unit of this type. In one source-conversion unit with one beamlet-limit means, at first the plurality of image-forming elements (deflectors) deflects a plurality of beamlets of the primary electron beam to form the plurality of parallel virtual images, and then the plurality of beam-limit openings cuts off peripheral electrons of the plurality of beamlets respectively. The first cross reference proposes a multi-beam apparatus with one source-conversion unit of this type, as shown in FIG. 1.

In FIG. 1, the single electron source 101 on the primary optical axis 100_1 generates the primary electron beam 102 seemingly coming from the crossover 101s. The condenser lens 110 focuses the primary electron beam 102 and thereby forming an on-axis virtual image 101sv of the crossover 101s. The peripheral electrons of the primary electron beam 102 are cut off by the main opening of the main aperture plate 171. The source-conversion unit 120 comprises the micro-deflector array 122 with two micro-deflectors 122_2 and 122_3, and a beamlet-limit plate 121 with three beam-limit openings 121_1, 121_2 and 121_3, wherein the beam-limit opening 121_1s aligned with the primary optical axis 100_1. If the beam-limit opening 121_1 is not aligned with the primary optical axis 100_1, there will be one more micro-deflector. The micro-deflectors 122_2 and 122_3 respectively deflect beamlets 102_2 and 102_3 of the primary electron beam 102, and thereby forming two off-axis virtual images 102_2v and 102_3v of the crossover 101s. The deflected beamlets 102_2 and 102_3 are perpendicularly incident onto the beamlet-limit plate 121. The beam-limit openings 121_1, 121_2 and 121_3 respectively cut off the peripheral electrons of the center beamlet 102_1 of the primary electron beam 102 and the deflected beamlets 102_2 and 102_3, and thereby limiting the currents thereof. The focusing power of the condenser lens no varies the current density of the primary electron beam 102, and therefore is able to change the currents of the beamlets 102_1~102_3. Consequently, three parallel virtual images 101sv, 102_2v and 102_3v form one virtual multi-source array 101v with variable currents.

The primary projection imaging system 130 which comprises the transfer lens 133 and the objective lens 131, focuses the three beamlets 102_1~102_3 to image the virtual multi-source array low onto the being-observed surface 7 and therefore form three probe spots 102_1s, 102_2s and 102_3s thereon. The transfer lens 133 focuses the three beamlets 102_1~102_3 to perpendicularly land on the being-observed surface 7. The deflection scanning unit 132 deflects the three beamlets 102_1~102_3 and consequently the three probe spots 102_1s~102_3s scan three individual regions of the being-observed surface 7. Secondary electron beams 102_1se, 102_2se and 102_3se emitted from the three scanned regions are in passing focused by the objective lens 131, deflected by the beam separator 160 to travel along the secondary optical axis 150_1, and focused onto and kept within the three detection elements 140_1, 140_2 and 140_3 of the electron detection device 140 respectively by the secondary projection imaging system 150. Therefore each detection element will provide an image signal of one corresponding scanned region.

As critical dimensions are shrunk, smaller and smaller particles become killers in the yield. For inspecting particles, an electron beam has a relatively shorter wavelength (such as 0.027 nm/2 keV) compared to particle dimensions (down to several nm), and therefore can provide higher detection sensitivity for small particles than an optical beam. Higher detection efficiency comes from higher detection sensitivity, and higher detection sensitivity comes from higher image contrast. The conventional single-beam apparatus scans the being-observed surface with normal incidence of the primary electron beam, and is criticized in detection sensitivity for particle inspection.

To achieve high detection sensitivity, one dark-field electron-beam (e-beam) inspection method is proposed in the second cross reference, which employs an oblique illumination. As well known, when a primary electron beam is incident onto a surface of a sample with an incidence angle α (relative to the normal of the sample surface), the angular distribution of the SE emission conforms Lambert's law (proportional to cos φ, and φ is emission angle relative to the surface normal), and the angular distribution of the BSE emission comprises a diffusely scattered part with Lambert's distribution and a reflection-like part with emission maximum in the reflection direction. Obviously, in the case with an oblique illumination, the SE emission direction and the reflection-like BSE emission direction will be different from each other. Furthermore, if the sample surface with a particle is obliquely illuminated by the primary electron beam, due to the difference in normal direction, the sample surface and the particle will be different in both the SE emission direction and the reflection-like BSE emission direction. Please refer to FIG. 8A and FIG. 8B. For the primary electron beam (102_1), the SEs (102_1b1) and BSEs (102_1b2) from the sample surface (7) display a regular scattering situation and therefore become signal electrons for a bright-field image, while the SEs (102_1d1) and BSEs (102_1d2) from the particle (7_P) displays an irregular scattering situation and therefore become signal electrons for a dark-field image. The dark-field e-beam method employs the difference between the regular scattering on a sample surface and the irregular scattering on a particle thereon. A dark-field BSE imaging, which has a high image contrast due to the particle, can be obtained by specifically arranging oblique illumination, collection of BSEs and guiding SEs.

Accordingly, it is necessary to provide a multi-beam which can simultaneously obtain images of plural subareas of an area on a sample surface with high image contrast and high throughput. Especially, a multi-beam apparatus which can detect uninvited particles on wafers/masks with high detection sensitivity and high throughput is needed to match the roadmap of the semiconductor manufacturing industry.

SUMMARY OF THE INVENTION

The object of this invention is to provide a multi-beam apparatus with an oblique illumination on a being-observed surface of a sample. In semiconductor manufacturing industry, the apparatus can function as a yield management tool to inspect defects and/or particles on wafers/masks with high detection efficiency and high throughput. The sample surface is slant to the primary optical axis of the apparatus. The apparatus employs a new source-conversion unit to form a slant virtual multi-source array with a plurality of beamlets from a single electron source, a primary projection imaging system to project the multi-source array onto the sample surface and therefore form a plurality of probe spots thereon with oblique illuminations of the plurality of beamlets. In the new source-conversion unit, each image-forming element comprises a deflector and a round-lens, and therefore the multi-source array can be tilted to match the oblique illumination. Each image-forming element may further comprise a stigmator to compensate the astigmatism aberration of the corresponding probe spot. The apparatus may further comprise a condenser lens to adjust the currents of the plurality of probe spots.

The apparatus may use a beam separator to separate a plurality of dark-field signal electron beams and the plurality of beamlets, a dark-field secondary projection imaging system and a dark-field electron detection device with a plurality of dark-field detection elements to focus and detect the plurality of dark-field signal electron beams, and therefore obtain a plurality of dark-field images, wherein an image-contrast-enhancing electrode may be employed to increase their image contrasts. The apparatus may use a bright-field secondary projection imaging system and a bright-field electron detection device with a plurality of bright-field detection elements to focus and detect a plurality of bright-field signal electron beams, and therefore obtain a plurality of bright-field images. The apparatus can operate in a multi-beam mode or a single-beam mode, and a single-beam detector may be added to make the single-beam mode easy to use.

Accordingly, the invention therefore provides a multi-beam apparatus for observing a surface of a sample, which comprises an electron source, a condenser lens below the electron source, a source-conversion unit below the condenser lens, a primary projection imaging system below the source-conversion unit and comprising an objective lens and a transfer lens, a deflection scanning unit inside the primary projection imaging system, a sample stage below the primary projection imaging system, a beam separator above the objective lens, a dark-field secondary projection imaging system above the beam separator, and a dark-field electron detection device with a plurality of dark-field detection elements. The source-conversion unit comprises an image-forming means with a plurality of image-forming elements and a beamlet-limit means with a plurality of beam-limit openings. The image-forming means is above the beamlet-limit means, and each image-forming element comprises a micro-deflector and a micro-round-lens. The electron source, the condenser lens, the source-conversion unit, the primary projection imaging system, the deflection scanning unit and the beam separator are aligned with a primary optical axis of the apparatus. The sample stage sustains the sample so that the surface faces to the objective lens and is slant to the primary optical axis. The dark-field secondary projection imaging system and the dark-field electron detection device are aligned with a dark-field secondary optical axis of the apparatus, and the dark-field secondary optical axis is not parallel to the primary optical axis. The electron source generates a primary electron beam along the primary optical axis. A plurality of micro-deflectors of the plurality of image-forming elements deflects a plurality of beamlets of the primary electron beam to form a plurality of parallel virtual images of the electron source and therefore a virtual multi-source array is converted from the electron source. A plurality of micro-round-lenses of the plurality of image-forming elements respectively focuses the plurality of beamlets to tilt the virtual multi-source array slant to the primary optical axis. The plurality of beamlets passes through the plurality of beam-limit openings respectively. A current of each beamlet is therefore limited by one corresponding beam-limit opening, and currents of the plurality of beamlets can be varied by adjusting the condenser lens. The primary projection imaging system images the virtual multi-source array onto the slant surface. The virtual multi-source array is tilted to make an image plane of the primary projection imaging system coincident with the slant surface. A plurality of probe spots is therefore formed thereon, and the deflection scanning unit deflects the plurality of beamlets to scan the plurality of probe spots respectively over a plurality of scanned regions within an observed area on the surface. A plurality of dark-field signal electron beams generated by the plurality of probe spots respectively from the plurality of scanned regions is in passing focused by the objective lens, deflected by the beam separator to the dark-field secondary projection imaging system, focused onto and kept within the plurality of dark-field detection elements by the dark-field secondary projection imaging system, and therefore the plurality of dark-field detection elements respectively provides a plurality of dark-field images with respect to the plurality of scanned regions.

The multi-beam apparatus may further comprise a main aperture plate below the electron source, which has a main opening aligned with the primary optical axis and functions as a beam-limit aperture for the primary electron beam. The transfer lens may focus the plurality of beamlets to land on the surface with equal amount of incidence angles. That each image-forming element may comprise a micro-stigmator for compensating astigmatism aberration of one corresponding probe spot. The incidence angles can be varied by the deflection scanning unit, and can be varied by the plurality of micro-deflectors. The apparatus can operate a single-beam mode. The multi-beam apparatus may further comprise a single-beam electron detector above the beam separator, which can be used in the single-beam mode. The each image-forming element may have a 4-pole structure which can function as the micro-deflector and the micro-round-lens.

The multi-beam apparatus may further comprise an image-contrast-enhancing electrode, which is placed above the surface to attract SEs generated by the plurality of beamlets not detected by the plurality of dark-field detection elements and therefore enhances image contrasts of the plurality of dark-field images. The multi-beam apparatus may further comprise a bright-field secondary projection imaging system and a bright-field electron detection device with a plurality of bright-field detection elements, wherein both are placed above the surface, along and aligned with a bright-field secondary optical axis not parallel to the primary optical axis. A plurality of bright-field signal electron beams generated by the plurality of probe spots respectively from the plurality of scanned regions can be focused onto and kept within the plurality of bright-field detection elements by the bright-field secondary projection imaging system, and therefore the plurality of bright-field detection elements respectively may provide a plurality of bright-field images with respect to the plurality of scanned regions.

The present invention also provides a multi-beam apparatus for observing a surface of a sample, which comprises an electron source, a condenser lens below the electron source, a source-conversion unit below the condenser lens, a primary projection imaging system below the source-conversion unit and comprising an objective lens and a transfer lens, a deflection scanning unit inside the primary projection imaging system, a sample stage below the primary projection imaging system, a bright-field secondary projection imaging system above the sample stage, and a bright-field electron detection device with a plurality of bright-field detection elements. The source-conversion unit comprises an image-forming means with a plurality of image-forming elements and a beamlet-limit means with a plurality of beam-limit openings. The image-forming means is above the beamlet-limit means, and each image-forming element comprises a micro-deflector and a micro-round-lens. The electron source, the condenser lens, the source-conversion unit, the primary projection imaging system, and the deflection scanning unit are aligned with a primary optical axis of the apparatus. The sample stage sustains the sample so that the surface faces to the objective lens and is slant to the primary optical axis. The bright-field secondary projection imaging system and the bright-field electron detection device are aligned with a bright-field secondary optical axis of the apparatus, and the bright-field secondary optical axis is not parallel to the primary optical axis. The electron source generates a primary electron beam along the primary optical axis. A plurality of micro-deflectors of the plurality of image-forming elements deflects a plurality of beamlets of the primary electron beam to form a plurality of parallel virtual images of the electron source and therefore a virtual multi-source array is converted from the electron source. A plurality of micro-round-lenses of the plurality of image-forming elements respectively focuses the plurality of beamlets to tilt the virtual multi-source array slant to the primary optical axis. The plurality of beamlets passes through the plurality of beam-limit openings respectively. A current of each beamlet is therefore limited by one corresponding beam-limit opening, and currents of the plurality of beamlets can be varied by adjusting the condenser lens. The primary projection imaging system images the virtual multi-source array onto the slant surface. The virtual multi-source array is tilted to make an image plane of the primary projection imaging system coincident with the slant surface. A plurality of probe spots is therefore formed thereon, and the deflection scanning unit deflects the plurality of beamlets to scan the plurality of probe spots respectively over a plurality of scanned regions within an observed area on the surface. A plurality of bright-field signal electron beams generated by the plurality of probe spots respectively from the plurality of scanned regions is focused onto and kept within the plurality of bright-field detection elements by the bright-field secondary projection imaging system, and therefore the plurality of bright-field detection elements respectively provides a plurality of bright-field images with respect to the plurality of scanned regions.

The multi-beam apparatus may further comprise a main aperture plate below the electron source, which has a main opening aligned with the primary optical axis and functions as a beam-limit aperture for the primary electron beam. The transfer lens may focuse the plurality of beamlets to land on the surface with equal amount of incidence angles. That each image-forming element may comprise a micro-stigmator for compensating astigmatism aberration of one corresponding probe spot. The incidence angles can be varied together by the deflection scanning unit and can be varied by the plurality of micro-deflectors. That each image-forming element may have a 4-pole structure which can function as the micro-deflector and the micro-round-lens. That each image-forming element may have an 8-pole structure which can function as the micro-deflector, the micro-round-lens and the micro-stigmator. That each image-forming element may comprise an upper 4-pole structure and a lower 4-pole structure thereunder, and the upper 4-pole structure and the lower 4-pole structure can be aligned with each other and have a 45° difference in azimuth. The upper 4-pole structure and the lower 4-pole structure may function as the micro-deflector, the micro-round-lens and the micro-stigmator.

The present invention also provides a method for observing a surface of a specimen, which comprises steps of providing a single charged particle beam, forming a virtual source array being slant to the surface and from a plurality of beamlets of the single charged particle beam, projecting the virtual source array onto the surface with the plurality of beamlets obliquely landing on the surface, and receiving a plurality of signal charged particle beams emanated from the surface.

The plurality of signal charged particle beams may comprise a plurality of dark-field signal electron beams, or a plurality of bright-field signal electron beams.

The present invention also provides an apparatus of plural charged particle beam, which comprises a single charged particle source for emitting a single charged particle beam, a source-conversion unit for forming a virtual source array being slant to a surface being observed and from a plurality of beamlets of the single charged particle beam, a primary projection imaging system for projecting the virtual source array onto the surface with the plurality of beamlets obliquely landing on the surface, a secondary projection imaging system for influencing a plurality of signal charged particle beams emanated from the surface, and a detection device for receiving the plurality of signal charged particle beams influenced by the secondary projection imaging system.

The apparatus may further comprise means for adjusting beam current between the single charged particle source and the source-conversion unit. The apparatus may further comprise a deflection scanning unit, above the surface, for scanning the plurality of beamlets on the surface. The apparatus may further comprise a beam separator, above an objective lens of the primary projection imaging system, for guiding a plurality of dark-field signal electron beams of the plurality of signal charged particle beams to the secondary projection imaging system.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 2A is a schematic illustration of one configuration of a new multi-beam apparatus in accordance with one embodiment of the present invention.

FIGS. 2B and 2C are respectively a schematic illustration of one operation mode of the new multi-beam apparatus in FIG. 2A.

FIG. 3 is a schematic illustration of another configuration of the new multi-beam apparatus in accordance with another embodiment of the present invention.

FIGS. 4A~4E are respectively a schematic illustration of a configuration of an image-forming means in FIG. 2A in accordance with another embodiment of the present invention.

FIGS. 5A and 5B are respectively a schematic illustration of a configuration of an image-forming means in FIG. 3 in accordance with another embodiment of the present invention.

FIGS. 6A and 6B are schematic illustrations of a configuration of an image-forming means in FIG. 3 in accordance with another embodiment of the present invention.

FIG. 7 is a schematic illustration of another configuration of the new multi-beam apparatus and one operation mode thereof in accordance with another embodiment of the present invention.

FIG. 9 is a schematic illustration of another configuration of the new multi-beam apparatus and one operation mode thereof in accordance with another embodiment of the present invention FIG. 10 is a schematic illustration of another configuration of the new multi-beam apparatus and one operation mode thereof in accordance with another embodiment of the present invention.

FIG. 11 is a schematic illustration of one operation mode of the new multi-beam apparatus in FIG. 3.

FIG. 11B is a schematic illustration of another configuration of the new multi-beam apparatus and one operation mode thereof in accordance with another embodiment of the present invention.

DETAILED DESCRIPTION OF EXAMPLE EMBODIMENTS

Figure 1:
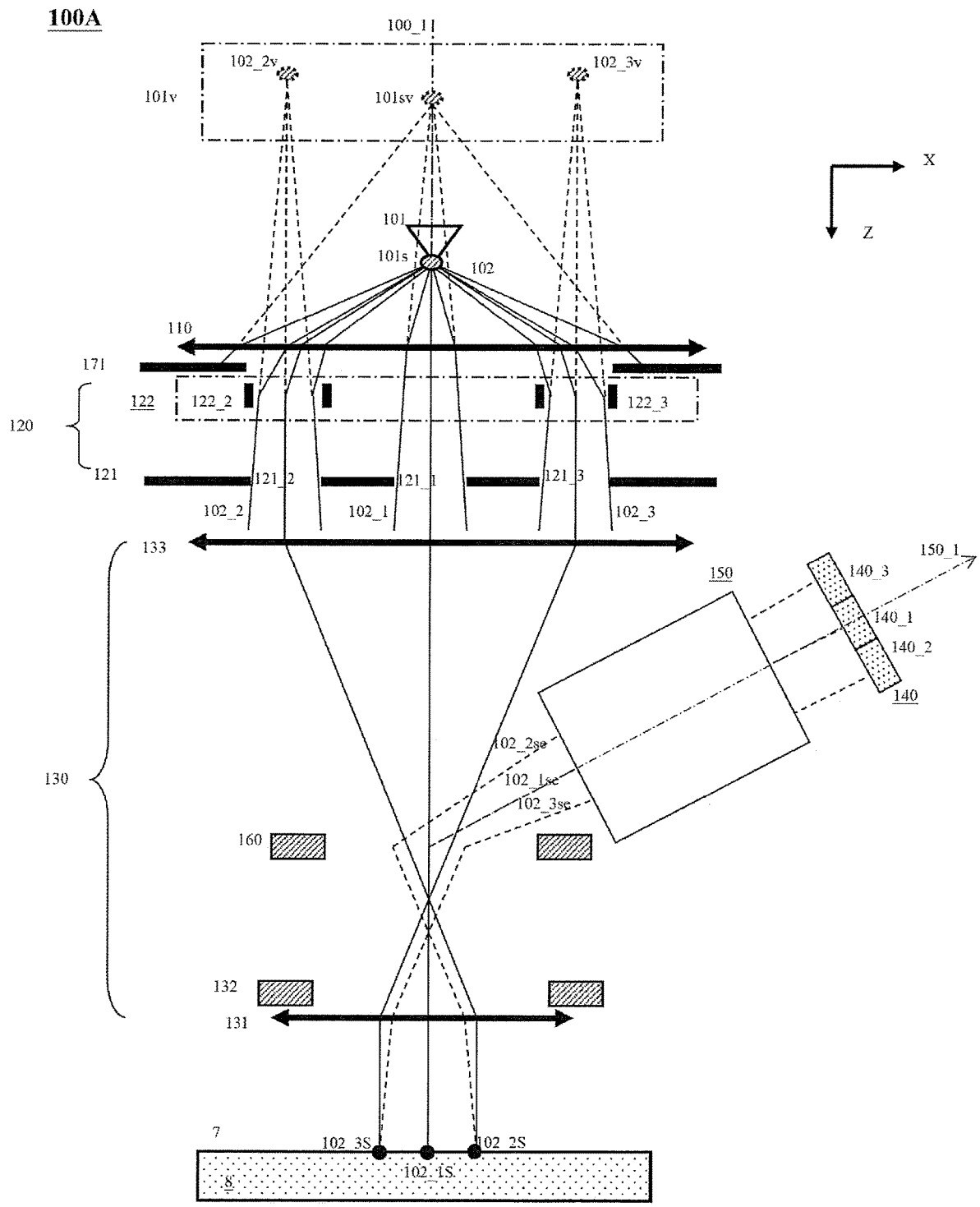
FIG. 1 is a schematic illustration of one configuration of a conventional multi-beam apparatus.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings, the same or like reference numbers refer to the same or like components or entities, and only the differences with respect to the individual embodiments are described. For sake of clarity, only three beamlets are available in the drawings, but the number of beamlets can be anyone.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of a lens (round or multi-pole), an imaging system or an apparatus", "radial" means "in a direction perpendicular to the optical axis", "on-axial" means "on or aligned with the optical axis" and "off-axis" means "not on or not aligned with the optical axis".

In this invention, "primary electrons" means "electrons emitted from an electron source and incident onto a being-observed or inspected surface of a sample, and "secondary electrons" means "electrons generated from the surface by the "primary electrons".

In this invention, "bright-field signal electrons" means "secondary electrons generated from a being-observed or inspected surface of a sample by a primary electron beam", and "dark-field signal electrons" means "secondary electrons generated from a particle on the surface by the primary electron beam".

In this invention, X, Y and Z axe form Cartesian coordinate. The primary optical axis of a multi-beam apparatus is on the Z-axis, and the beam of primary electrons travels along the Z-axis.

In this invention, "an illumination angle" means "the smaller angle between the primary optical axis of a multi-beam apparatus and the normal of the being-observed surface of a sample therein", "normal illumination" means "the illumination angle is zero" and "an oblique illumination" means "the illumination angle is not zero".

In this invention, "single-beam mode" means only one beamlet is in use, and "multi-beam mode" means a least two beamlets are in use.

In this invention, all terms relate to through-holes, openings and orifices mean openings or holes penetrated through one plate.

Next, the present invention will provide some embodiments of a new multi-beam apparatus for observing a sample surface with an oblique illumination. The sample surface is slant to the primary optical axis of this multi-beam apparatus, and forma a large illumination angle (such as 30° or larger). The multi-beam apparatus employs a new source-conversion unit for generating a plurality of parallel virtual images with a plurality of beamlets from a single electron source so as to form a virtual multi-source array which is slant to the primary optical axis, a primary projection imaging system for imaging the virtual multi-source array onto the sample surface so as to form a plurality of probe spots thereon. The multi-beam apparatus may also use a condenser lens for adjusting the currents of the plurality of probe spots. In the new source-conversion unit, each image-forming element comprises a deflector and a round-lens, and therefore the virtual multi-source array can be tilted to match the slant sample surface. Each image-forming element may also comprise a stigmator to compensate astigmatism aberration of the corresponding probe spot.

The multi-beam apparatus uses a beam separator for guiding a plurality of dark-field signal electron beams, and a dark-field secondary projection imaging system for focusing and keeping the plurality of dark-field signal electron beams onto a plurality of dark-field detection elements of a dark-field electron detection device. Therefore a plurality of dark-field images can be obtained by the plurality of dark-field detection elements. In this case, a contrast-enhancing electrode can be used to prevent a plurality of bright-field signal electron beams to be detected by the plurality of dark-field detection elements and hence enhance the image contrasts of the plurality of dark-field images. The multi-beam apparatus can also use a bright-field secondary projection imaging system to focus and keep the plurality of bright-field signal electron beams onto a plurality of bright-field detection elements of a bright-field electron detection device. Therefore a plurality of bright-field images can be obtained by the plurality of bright-field detection elements.

One embodiment 200A of the new mutli-beam apparatus is shown in FIG. 2A. The being-observed surface 7 of the sample 8 will be supported by a stage (not shown here) to form an illumination angle α. The single electron source 101 is on the primary optical axis 200_1. The condenser lens 110, the main aperture plate 171, the new source-conversion unit 120-1, the primary projection imaging system 13o, the deflection scanning unit 132 and the beam separator 160 are placed along and aligned with the primary optical axis 200_1. The dark-field secondary projection imaging system 150 and the dark-field electron detection device 140 are placed along and aligned with the dark-field secondary optical axis 150_1.

The main aperture plate 171 can be placed above the condenser lens no for reducing Coulomb Effect as early as possible, or immediately above the new source-conversion unit 120-1 as shown here. In the new source-conversion unit 120-1, the image-forming means is the micro-deflector-lens array 122-1 with three micro-deflector-lens elements 122_1DL, 122_2DL and 122_3DL, and the beamlet-limit means is the beamlet-limit plate 121 with three beam-limit openings 121_1, 121_2 and 121_3. Each micro-deflector-lens element is one image-forming element, and comprises a micro-deflector and a micro-round-lens. If the beam-limit opening 121_1 is aligned with the primary optical axis 200_1 as shown here, the micro-deflector-lens element 122_1DL can only comprise one micro-round-lens. The primary projection imaging system 130 comprises a transfer lens 133 and an objective lens 131. The deflection scanning unit 132 comprises at least one deflector. The beam separator 160 comprises a Wien Filter. The dark-field electron detection device 140 comprises three dark-field detection elements 140_1, 140_2 and 140_3.

FIGS. 2B and 2C show two operation modes of the new multi-beam apparatus 200A. The single electron source 101 comprises a cathode, an extraction and/or an anode, wherein the primary electrons are emitted from the cathode and extracted and/or accelerated to form a primary electron beam 102 with high energy (such as 8~20 keV), a high angular intensity (such as 0.5~5 mA/sr) and a crossover (virtual or real) 101s shown by the on-axis oval mark here. Therefore it is convenient to think that the primary electron beam 102 is emitted from the crossover 101s, and the single electron source 101 is simplified to be the crossover In FIG. 2B, the condenser lens 110 is off. The primary electron beam 102 passes through the condenser lens 110 without focusing influence and its peripheral electrons are cut off by the main opening of the main aperture plate 171. The micro-deflectors of the micro-deflector-lens elements 122_2DL and 122_3DL respectively deflect beamlets 102_2 and 102_3 of the primary electron beam 102. The deflected beamlets 102_2 and 102_3 respectively form the off-axis virtual images 102_2v and 102_3v of the crossover 101s. The micro-round-lenses of the micro-deflector-lens elements 122_2DL and 122_3DL respectively focus beamlets 102_2 and 102_3 to move the virtual images 102_2v and 102_3v upwards, and the micro-round-lens of the micro-deflector-lens element 122_1DL focuses the on-axis beamlet 102_1 of the primary electron beam 102 to form an on-axis virtual image 102_1V of the crossover 101s. The virtual images 102_1v~102_3v form the virtual multi-source array 101v which is slant to the primary optical axis 200_1. The deflected beamlets 102_2 and 102_3 are parallel or substantially parallel to the primary optical axis 100_1 and therefore perpendicularly incident onto the beamlet-limit plate 121. The beam-limit openings 121_1~121_3 respectively cut off the peripheral electrons of the beamlets 102_1~102_3, and thereby limiting the currents thereof.

Next the virtual images 102_1v-102_3v are imaged onto the surface 7 by the transfer lens 133 and the objective lens 131, and form three probe spots 102_1s, 102_2s and 102_3s thereon. The micro-round-lenses of the micro-deflector-lens elements 122_1DL~122_3DL adjust the virtual multi-source array 101v to make the image plane of the primary projection imaging system 130 coincident with the slant sample surface 7. The transfer lens 133 focuses the three besmlets 102_1~102_3 to land on the surface 7 with same angles of incidence. Hence the three besmlets 102_1~102_3 will substantially pass through the front focal point of the objective lens 131. If the objective lens 131 comprises one magnetic lens, the two off-axis beamlets 102_2 and 102_3 may not exactly pass through the front focal point due to the influence of magnetic rotation, and this is very helpful to reduce the Coulomb Effect at the beamlet crossover CS. The deflection scanning unit 132 deflects the three beamlets 102_1~102_3 and consequently the three probe spots 102_1S~102_3s scan three individual regions on the surface 7.

The dark-field signal electron beams 102_1d, 102_2d and 102_3d emitted from the three scanned regions at first are in passing focused and deflected by the objective lens 131 and the deflection scanning unit 132 respectively. Then the dark-field signal electron beams 102_1d, 102_2d and 102_3d are deflected to travel along the dark-field secondary optical axis 150_1 by the beam separator 160, and respectively focused onto the dark-field detection elements 140_1, 140_2 and 140_3 of the dark-field electron detection device 140 by the dark-field secondary projection imaging system 150. Therefore each detection element will provide an dark-field image signal of one corresponding scanned region.

To keep the focused dark-field signal electron beams 102_1d~102_3d within the dark-field detection elements 140_1~140_3 so as to avoid cross-talks therebetween, the dark-field secondary projection imaging system 150 may comprise one anti-scanning deflector to compensate the deflection influence of deflection scanning unit 132. Different samples usually request different observing conditions, such as the landing energies and the currents of the beamlets 102_1~102_3. This is especially true for inspecting wafers/masks in semiconductor manufacturing industry. The focusing power of the objective lens 131 will be changed with respect to the observing conditions, and the influence on the dark-field signal electron beams 102_1d-102_3d will vary accordingly. Therefore the dark-field secondary projection imaging system 150 may comprise one zoom lens to compensate the variation of the objective lens 131 in focusing influence, and one anti-rotation magnetic lens to compensate the variation in rotation influence if the objective lens 131 comprises a magnetic lens. If the dark-field electron detection device 140 is perpendicular to the dark-field secondary optical axis 150_1, the slant surface 7 will defocus the dark-field signal electron beams 102_1d~102_3d, and therefore enlarge the sizes thereof. The defocusing may make a part of one focused dark-field signal electron beam out of the corresponding dark-field detection element and thereby generating the cross-talks too. Hence the dark-field electron detection device 140 can be tilted to compensate the defocusing due to the slant surface 7.

Each of the two off-axis probe spots 102_2s and 102_3s comprises the off-axis aberrations generated by the objective lens 131, the transfer lens 133 and the condenser lens no when being turned on. The off-axis aberrations of each off-axis probe spot can be reduced by individually optimizing the trajectory of the corresponding beamlet. The static parts of the off-axis aberrations can be reduced by adjusting the deflection power of the corresponding micro-deflector. The dynamic parts of the off-axis aberrations can be reduced by optimizing the performance of the deflection scanning unit 132 which therefore may comprise more than one deflector for realizing scanning with smaller aberrations. In addition, the left field curvature aberrations of the two off-axis probe spots 102_2s and 102_3s can be compensated by adjusting the focusing powers of the micro-round-lenses of the micro-deflector-lens elements 122_2DL and 122_3DL.

The condenser lens no is turned on in FIG. 2C, which focuses the primary electron beam 102 and therefore moves the virtual multi-source array 101v further upward. The focusing function of the condenser lens no increase the current density of the focused primary electron beam 102, and thereby increasing the currents of the beamlets 102_1~102_3 higher than in FIG. 2B. Hence, the currents of all the beamlets can be continuously adjusted by the condenser lens 110.

Similar to a conventional SEM, the size of each probe spot is minimized by balancing the geometric and diffraction aberrations, Gaussian image size and Coulomb effect. The focusing function of the condenser lens 110 changes the imaging magnification from the crossover 101s to the being-observed surface 7, which influences the balance and therefore may increase the size of each probe spot. To avoid largely increasing the sizes of the probe spots when the currents of the beamlets are largely varied, the sizes of the beam-limit openings 121_1~121_3 can be accordingly changed. Consequently, the beamlet-limit plate 121 is preferred having multiple groups of beam-limit openings. The sizes of beam-limit openings in a group are different from those in another group. Alternately, the focusing power of the transfer lens 133 can be changed to reduce the variation of the imaging magnification. The trajectories of the off-axis beamlets 102_2 and 102_3 will be influenced by the focusing power variation of the transfer lens 133, and deflection powers of the micro-deflectors of the micro-deflector-lens elements 122_2DL and 122_3DL can be accordingly adjusted to keep the trajectories. In this way, the beamlets 102_2 and 102_3 may be slightly not parallel to the primary optical axis 200_1.

In FIG. 2B and FIG. 2C, the beamlets 102_1~102_3 land on the surface 7 along the primary optical axis 200_1, i.e. their angles of incidence are equal to the illumination angle α. The beamlets 102_1~102_3 can also be tilted to land on the surface 7 with same angles of incidence but not equal to the illumination angle α. The emission direction of each dark-field signal electron beam varies with the angle of incident of the corresponding beamlet, and therefore the tilting the corresponding beamlet may improve the image contrast. The beamlets 102_1~102_3 can be tilted by the deflection scanning unit 132, or by the micro-deflectors of the micro-deflector-lens elements 122_1D~122_3DL.

Another embodiment 210A of the new multi-beam apparatus is shown in FIG. 3, which uses another new source-conversion unit 120-2. The new source-conversion unit 120-2 is different from the new source-conversion unit 120-1 in the image-forming means, wherein the image-forming means is the micro-deflector-lens-and-compensator array 122-2 with three micro-deflector-lens-and-compensator elements 122_1dc, 122_2dc and 122_3dc. Each micro-deflector-lens-and-compensator element is one image-forming element, and comprises a micro-deflector, a micro-round-lens and a micro-stigmator. Same as the micro-deflector-lens array 122-1 in FIG. 2A, the micro-deflectors and the micro-round-lenses are used to change the single electron source 101 into one slant virtual multi-source array which makes the image plane of the primary projection imaging system 130 coincide with the slant being-observed surface 7 of the sample 8, and the micro-round-lenses are used to compensate the field curvature aberrations of the images of the slant multi-source array on the surface 7. With the new source-conversion unit 120-2, the micro-stigmators can compensate the astigmatism aberrations of the images and thereby further improving image resolutions. In comparison with the micro-deflector-lens array 122-1, the micro-deflector-lens-and-compensator array 122-2 is an advanced image-forming means.

Each of the micro-deflector-lens elements 122_1DL~122_3DL in FIG. 2A can simply comprise two curved electrodes as shown in FIG. 4A. To clear express how to orientate two curved electrodes of each micro-deflector-lens element, three more 122_11DL, 122_21DL and 122_31DL are shown. Within each micro-deflector-lens element, the inner surfaces of the two curved electrodes form a circular shape and are perpendicular to the required deflection direction of the corresponding beamlet. Therefore the two curved electrodes can be set at voltages to generate one dipole field (i.e. deflection field) in the required deflection direction and one round-lens field. For example, the micro-deflector-lens element 122_2DL has two curved electrodes perpendicular to the X-axis and therefore can deflect the beamlet 102_2 in the X-axis direction, and the micro-deflector-lens element 122_11DL has two curved electrodes perpendicular to the Y-axis and therefore can deflect one beamlet in the Y-axis direction. The on-axis micro-deflector-lens element 122_1DL is only required to focus the on-axis beamlet 102_1, and therefore can be formed by one annular electrode for generating one round-lens field.

From the manufacturing point of view, all the micro-deflector-lens elements are at least preferred to have same configurations. Accordingly, the micro-deflector-lens element 122_1DL can have the same configuration as others, such as the micro-deflector-lens element 122_2DL as shown in FIG. 4B. Due to all the micro-deflector-lens elements are not same in orientation, it is difficult to make one micro-deflector-lens array 122-1 comprising a large number of the micro-deflector-lens elements. From the manufacturing point of view, all the elements are preferred to have same configuration and same orientation in geometry. Hence a micro-deflector-lens element with a quadrupole or 4-pole configuration can meet this requirement, as shown in FIG. 4C. The inner surfaces of the four curved electrodes of each micro-deflector-lens element form a circular shape, and therefore a deflection field in any direction and one round-lens field can therefore be generated.

To operate one micro-deflector-lens element, a driving-circuit needs connecting with each electrode thereof. In FIG. 4D, to prevent the driving-circuits from being damaged by the primary electron beam 102, one upper electric-conduction plate 122-CL1 with three upper through-holes is placed above the electrodes of all the micro-deflector-lens elements 122_1DL~122_3DL. The upper electric-conduction plate 122-CL1 also shortens the upper fringe ranges of the fields of all the micro-deflector-lens elements. The lower electric-conduction plate 122-CL2 with three lower through-holes shortens the lower fringe ranges of the fields of all the micro-deflector-lens elements. The upper insulator plates 122-IL1 with three upper orifices and the lower insulator plates 122-IL2 with three lower orifices support the micro-deflector-lens elements 122_1DL~122_3DL and therefore make the image-forming means 122-1 more stable in configuration.

The upper through-holes, the upper orifices, the lower through-holes and the lower orifices are aligned with the micro-deflector-lens elements respectively. For each micro-deflector-lens element, the radial sizes of the corresponding upper and lower through-holes are equal to or smaller than the inner radial dimensions of the curved electrodes, and smaller than the radial sizes of the corresponding upper and lower orifices. To reduce the electrons scattered from the sidewall of each upper through-hole, each upper through-hole is preferred in an upside-down funnel shape; i.e. the small end thereof is on the entrance side, as shown in FIG. 4E.

Each of the micro-deflector-lens-and-compensator elements 122_1dc~122_3dc in FIG. 3 can simply have a quadrupole or 4-pole configuration, as shown in FIG. 5A. To clear express how to orientate four curved electrodes of each micro-deflector-lens element, three more 122_11dc, 122_21dc and 122_31dc are shown. Within each micro-deflector-lens-and-compensator element, the inner surfaces of the four curved electrodes form a circular shape and two of the four curved electrodes are perpendicular to the required deflection direction of the corresponding beamlet. Therefore the four curved electrodes can be set at voltages to generate one round-lens field, one dipole field (i.e. deflection field) in any direction and one quadrupole field in the required deflection direction. For example, the micro-deflector-lens-and-compensator element 122_2dc has two curved electrodes perpendicular to the X-axis and therefore can generate one quadrupole field in the X-axis direction, and the micro-deflector-lens-and-compensator element 122_31dc has two curved electrodes perpendicular to the direction 122_31dc_2 and therefore can generate one quadrupole field in this direction. The on-axis micro-deflector-lens-and-compensator element 122_1dc is only required to focus the on-axis beamlet 102_1, and therefore can be orientated in any directions.

From the manufacturing point of view, all the micro-deflector-lens-and-compensator elements are most preferred to have same configurations and same orientation in geometry. An octupole-lens structure comprising eight curved electrodes whose inner surfaces form a circular shape, can generate one deflection field in any direction, one round-lens field and one quadrupole field in any direction. Therefore all the micro-deflector-lens-and-compensator elements can have same octupole-lens structures oriented in same directions, as shown in FIG. 5B. For the same reasons mentioned above, the micro-deflector-lens-and-compensator elements can be sandwiched by the upper and lower electric-conduction plates 122-CL1 and 122-CL2 and the upper and lower insulator plates 122-IL1 and IL2 in the same way as the image-forming means 122-1 in FIG. 4E.

FIG. 6A shows another embodiment of the micro-deflector-lens-and-compensator array 122-2 in FIG. 3. Each micro-deflector-lens-and-compensator element comprises a pair of 4-pole configurations which are placed in two layers, aligned with each other and have a 45° difference in azimuth or orientation. The micro-deflector-lens-and-compensator element 122_1dc, 122_2dc and 122_3dc respectively comprise the pair of the upper and lower 4-pole configurations 122_1dc-1 and 122_1dc-2, the pair of the upper and lower 4-pole configurations 122_2dc-1 and 122_2dc-2, and the pair of the upper and lower 4-pole configurations 122_3dc-1 and 122_3dc-2. The upper 4-pole configurations 122_1dc-1, 122_2dc-1 and 122_3dc-1 are placed in one upper layer. The lower 4-pole configurations 122_1dc-2, 122_2dc-2 and 122_3dc-2 are placed in one lower layer, respectively below and aligned with the upper 4-pole configurations 122_1dc-1, 122_2dc-1 and 122_3dc-1. For example, with respect to the X axis, the azimuths of the upper and lower 4-pole configurations 122_1dc-2C-1 and 122_2dc-2 are respectively 0° and 45° as shown in FIG. 6B. For the same reasons mentioned above, the upper and lower layers are shielded by the upper and lower electric-conduction plate 122-CL1 and 122-CL2, and supported by the upper and lower insulator plates 122-IL1 and 122-IL2 and a middle insulator plate 122-IL3 with multiple middle orifices. For each micro-deflector-lens-and-compensator element, the deflection field in any desired direction and the round-lens field can be generated by either or both of the upper and lower 4-pole configurations, and the quadrupole field in any direction can be generated by both of the upper and lower 4-pole configurations.

Another embodiment 220A of the new multi-beam apparatus and its one operation mode are shown in FIG. 7, which uses an image-contrast-enhancing electrode 143 to enhance the image contrasts of the images detected by the dark-field electron detection device 140. The image-contrast-enhancing electrode 143 attracts the SE beams 102_1se, 102_2se and 102_3se generated by the probe spots 102_1s, 102_2s and 102_3s from the being-observed surface 7 and the particles thereon. Consequently, only the dark-field BSE beams 102_1d2, 102_2d2 and 102_3d2 can travel upwards along the primary optical axis 220_1 and therefore can be detected by the dark-field detection elements 140_1~140_3.

Figure 8A:
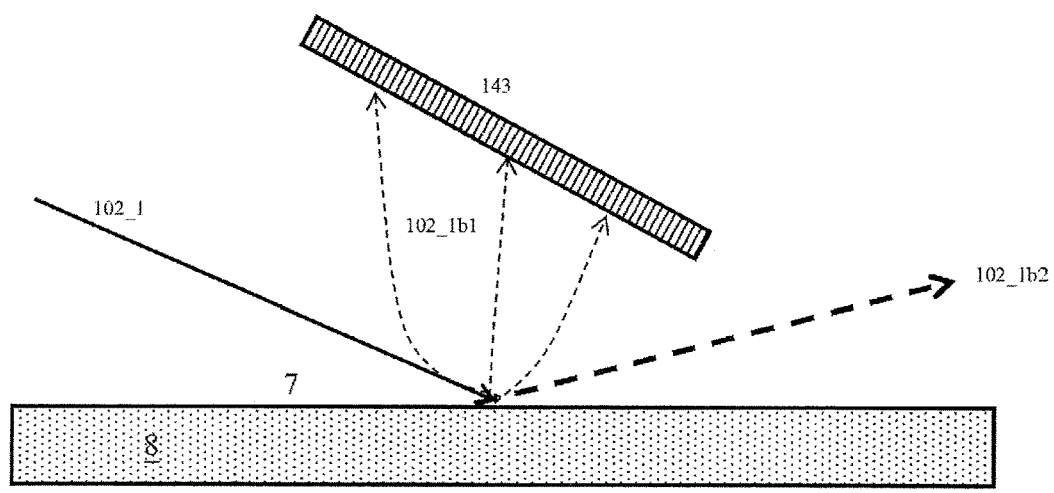
FIGS. 8A~8C are schematic illustrations on the function of the image-contrast-enhancing electrode in the new multi-beam apparatus in FIG. 7.
Figure 8B:
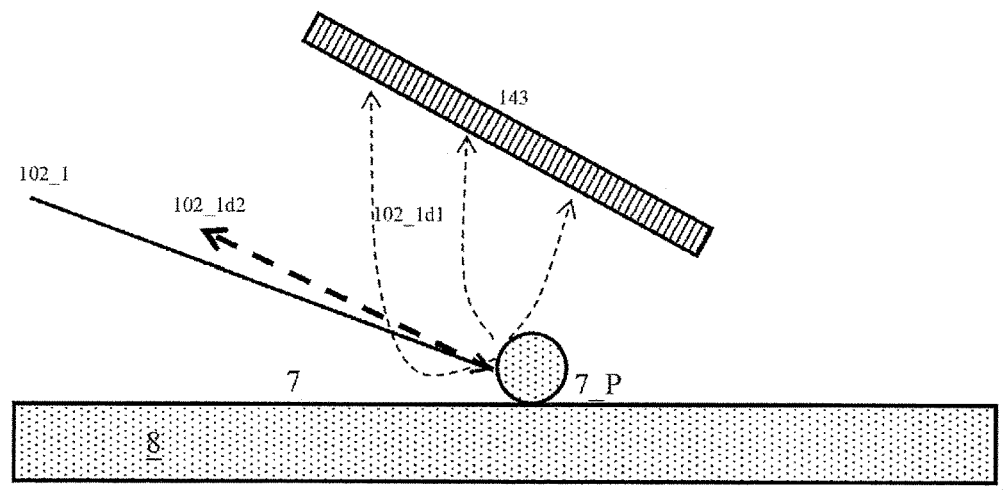
Figure 8C:
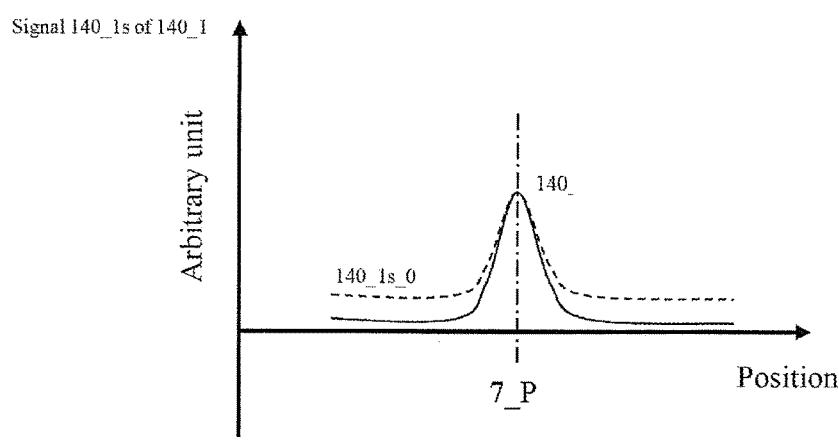

FIGS. 8A-8C take the beamlet 102_1 as an example to show how the image contrast is enhanced when there is one particle 7_P on the being-observed surface 7. In FIG. 8A, the beamlet 102_1 impinges on the surface 7, the bright-field SE beam 102_1b1 is attracted by the image-contrast-enhancing electrode 143 and consequently lands thereon, and the bright-field BSE beam 102_1b2 travels in the reflection direction of the surface 7. In FIG. 8B, the beamlet 102_1 impinges on the particle 7_P, the dark-field SE beam 102_1d1 is attracted by the image-contrast-enhancing electrode 143 and consequently lands thereon, and the dark-field BSE beam 102_1d2 travels in the reflection direction of the particle 7_P. Hence the SE beam 102_1se in FIG. 7 is actually formed by either the bright-field SE beam 102_1b1 or the dark-field SE beam 102_1d1. FIG. 8C shows the signal 140_1s of the dark-field detection element 140_1. The dash line and the solid line respectively express the signals without and with, the image-contrast-enhancing electrode 143. As the beamlet 102_1 approaches the particle 7_P, the signal 140_1s is getting stronger from the lower value 140_1s_0 to the higher value 140_1s_1. Therefore the particle 7_P will be shown in the image with a darker background and a higher contrast when the image-contrast-enhancing electrode 143 is used.

Another embodiment 300A of the new multi-beam apparatus is shown in FIG. 9, which detects the bright-field signal electron beams 102_1b, 102_2b and 102_3b generated by the probes 102_1S, 102_2s and 102_3s from the being-observed surface 7 of the sample 8. In comparison with the embodiment 210A in FIG. 3, one bright-field secondary projection imaging system 250 and one bright-field electron detection device 240 with three bright-field detection elements 240_1, 240_2 and 240_3 are placed along the bright-field secondary optical axis 250_1. For the surface 7, the primary optical axis 300 is in the incidence direction and the bright-field secondary optical axis 250_1 is in the reflection direction. The bright-field signal electron beams 102_1b~102_3b are focused onto the bright-field detection elements 240_1~240_3 respectively by the bright-field secondary projection imaging system 250, and therefore each bright-field detection element generates one bright-field image. One bright-field image comprises a material contrast and a topography contrast of the sample surface 7.

Similar to the foregoing dark-field secondary projection imaging system 150, the bright-field secondary projection imaging system 250 may comprise one anti-scanning deflector. The positions of the focused bright-field signal electron beams 102_1*b*, 102_2*b* and 102_3*b* on the bright-field electron detection device 240 will change as the probe spots 102_1*s*~102_3*s* scan the surface 7, and the anti-scanning deflector can cancel the displacements of the positions and therefore avoid the cross-talks. In addition, the bright-field secondary projection imaging system 250 can be configured to attract the bright-field SEs as much as possible to increase the signal-noise ratios of the bright-field images. If the bright-field electron detection device 240 is perpendicular to the bright-field secondary optical axis 250_1, the slant surface 7 will defocus the bright-field signal electron beams 102_1*b*~102_3*b*, and therefore enlarge the sizes thereof. The defocusing may make a part of one focused bright-field signal electron beam out of the corresponding bright-field detection element and thereby generating the cross-talks. Hence the bright-field electron detection device 240 can be tilted to compensate the defocusing due to the slant surface 7.

Based on the embodiment 210A in FIG. 3 and the embodiment 300A in FIG. 9, another embodiment 400A of the new multi-beam apparatus is proposed. FIG. 10 shows the configuration of the embodiment 400A and one of its operation modes. For the being-observed surface 7 of the sample 8, the embodiment 400A employs the dark-field secondary projection imaging system 150 and the dark-field electron detection device 140 to obtain the dark-field images, and bright-field secondary projection imaging system 250 and the bright-field electron detection device 240 to obtain the bright-field images.

As well known, the more beamlets scan the being-observed surface 7, the more charges may be built thereon. Hence for a specific observation application, some beamlets are better to be blanked, such as every other beamlet. In this case, those beamlets can be directed to be blanked by the beamlet-limit plate 121 of the new source-conversion unit in the foregoing embodiments. FIG. 11A shows such an operation mode of the embodiment 210A in FIG. 3, wherein the micro-deflector-lens-and-compensator 122_1*dc* deflects the beamlet 102_1 to be blanked by the beamlet-limit plate 121. Any of all the foregoing embodiments can operate either one multi-beam mode or one single-beam mode. One single-beam mode may be used when searching optimistic imaging conditions (landing energy and probe current) for an observation application.

To make the single-beam mode easy to use, the foregoing embodiments can further comprise one single-beam detector individually. Taking the embodiment 210A in FIG. 3 as an example, FIG. 11B shows another embodiment 211A of the new multi-beam apparatus, wherein a single-beam electron detector 141 is added. Here the beamlet 102_1 is taken as the beamlet in use. The beam separator 160 deflects the corresponding dark-field signal electron beam 102_1*d* to be detected by the single-beam electron detector 141. Using the single-beam electron detector 141 can avoid the procedures of adjusting the dark-field secondary projection imaging system 150 with respect to the focusing power variation of the objective lens 131. As mentioned above, the focusing power of the objective lens 131 will change when the landing energy and/or current of the beamlet in use are changed. Generally speaking, the single-beam detector 14 can collect more dark-field signal electrons than one detection element of the dark-field electron detection device 140, and therefore can provide a higher signal-noise ratio.

In summary this invention proposes a new multi-beam apparatus for observing the being-observed surface of a sample with oblique illumination. The apparatus can function as a yield management tool to defects and/or particles on wafers/masks with high detection sensitivity and high throughput in semiconductor manufacturing industry. The sample surface is slant to the primary optical axis of the apparatus. The apparatus employs a new source-conversion unit to form a slant virtual multi-source array with a plurality of beamlets from a single electron source, a primary projection imaging system to project the multi-source array onto the slant sample surface and therefore form a plurality of probe spots thereon with oblique illuminations of the plurality of beamlets. The apparatus can use a condenser lens to adjust the currents of the plurality of probe spots. In the new source-conversion unit, the image-forming means is on the upstream of the beamlet-limit means, the image-forming means comprises a plurality of micro-deflector-lens elements for forming the virtual multi-source array slant to the primary optical axis, or a plurality of micro-deflector-lens-and-compensator elements for forming the slant virtual multi-source array and compensating the aberrations of the plurality of probe spots.

The apparatus can use a beam separator to separate a plurality of dark-field signal electron beams from the plurality of beamlets, and a dark-field secondary projection imaging system and a dark-field electron detection device to focus and detect the plurality of dark-field signal electron beams and therefore obtain a plurality of dark-field images, wherein an image-contrast-enhancing electrode can be employed to increase their image contrasts. The apparatus can use a bright-field secondary projection imaging system and a bright-field electron detection device to focus and detect the plurality of bright-field signal electron beams and therefore obtain a plurality of bright-field images. The apparatus can operate in a multi-beam mode or a single-beam mode, and a single-beam detector can be added to make the single-beam mode easy to use.

Although the present invention has been explained in relation to its preferred embodiment, it is to be understood that other modifications and variation can be made without departing the spirit and scope of the invention as hereafter claimed.

What is claimed is:

1. A charged-particle beam apparatus, comprising:
a charged particle source configured to provide a primary beam;
an image forming unit configured to form a plurality of virtual images of the charged particle source using a plurality of beamlets derived from the primary beam, wherein the plurality of virtual images of the charged particle source are slant to a primary optical axis;
a first projection imaging system configured to form a plurality of probe spots on a sample from the plurality of beamlets, wherein the first projection imagining system comprises an objective lens;
a second projection system configured to focus a plurality of secondary beams generated by the plurality of probe spots on the sample; and
a detection device with a plurality of detection elements configured to receive the plurality of secondary beams.

2. The charged-particle beam apparatus according to claim 1, wherein the first projection imaging system includes a transfer lens configured to focus the plurality of beamlets and enable the plurality of beamlets to land on the sample with equal amounts of incidence angles.

3. The charged-particle beam apparatus according to claim 1, further comprising a beam separator configured to separate the plurality of beamlets and the plurality of secondary beams.

4. The charged-particle beam apparatus according to claim 3, wherein the apparatus can operate in a single-beam mode.

5. The charged-particle beam apparatus according to claim 4, further comprising a single-beam electron detector above the beam separator, which can be used in the single-beam mode.

6. The charged-particle beam apparatus according to claim 1, wherein the image forming unit comprises a plurality of image-forming elements.

7. The charged-particle beam apparatus according to claim 6, wherein the plurality of image-forming elements comprises a micro-stigmator for compensating astigmatism aberration of one corresponding probe spot.

8. The charged-particle beam apparatus according to claim 6, wherein the plurality of image-forming elements are configured to deflect the plurality of beamlets to change corresponding incidence angles.

9. The charged-particle beam apparatus according to claim 6, wherein the plurality of image-forming elements comprises a 4-pole structure configured to function as a micro-deflector and a micro-round-lens.

10. The charged-particle beam apparatus according to claim 6, wherein the plurality of image-forming elements comprises an 8-pole structure configured to function as a micro-deflector, a micro-round-lens, and a micro-stigmator.

11. The charged-particle beam apparatus according to claim 6, wherein the plurality of image-forming elements comprises an upper 4-pole structure and a lower 4-pole structure thereunder, and the upper 4-pole structure and the lower 4-pole structure are aligned with each other and have a 45° difference in azimuth.

12. The charged-particle beam apparatus according to claim 11, wherein the upper 4-pole structure and the lower 4-pole structure are configured to function as a micro-deflector, a micro-round-lens, and a micro-stigmator.

13. The charged-particle beam apparatus according to claim 1, wherein the charged particle source, the imaging forming unit, and the first projection imaging system are aligned with the primary optical axis of the apparatus.

14. The charged-particle beam apparatus according to claim 1, further comprising a beam-limiting element for limiting the plurality of beamlets with a plurality of beam-limit openings.

15. The charged-particle beam apparatus according to claim 14, further comprising a condenser lens configured to focus the primary beam to vary electric currents of the plurality of probe spots on the sample.

16. The charged-particle beam apparatus according to claim 6, wherein the plurality of image-forming elements is configured to deflect the plurality of beamlets derived from the primary electron beam to form the plurality of virtual images of the charged particle source.

17. The charged-particle beam apparatus according to claim 6, wherein the plurality of image-forming elements may comprise a plurality of micro-round-lenses.

18. The charged-particle beam apparatus according to claim 17, wherein the plurality of micro-round-lenses of the plurality of image-forming elements focuses the plurality of beamlets to tilt the virtual images of the charged particle source slant to the primary optical axis.

* * * * *